(12) United States Patent
Kim et al.

(10) Patent No.: US 12,268,042 B2
(45) Date of Patent: Apr. 1, 2025

(54) VARIABLE RESISTANCE MEMORY DEVICE

(71) Applicant: Samsung Electronics Co., Ltd., Suwon-si (KR)

(72) Inventors: Hyuncheol Kim, Seoul (KR); Yongseok Kim, Suwon-si (KR); Dongsoo Woo, Seoul (KR); Kyunghwan Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 409 days.

(21) Appl. No.: 17/746,247

(22) Filed: May 17, 2022

(65) Prior Publication Data

US 2023/0108552 A1 Apr. 6, 2023

(30) Foreign Application Priority Data

Oct. 1, 2021 (KR) .................. 10-2021-0130739

(51) Int. Cl.
| | |
|---|---|
| *H01L 21/00* | (2006.01) |
| *H10K 10/50* | (2023.01) |
| *H10K 19/00* | (2023.01) |
| *H10K 85/20* | (2023.01) |

(52) U.S. Cl.
CPC .......... *H10K 19/202* (2023.02); *H10K 10/50* (2023.02); *H10K 85/221* (2023.02)

(58) Field of Classification Search
CPC ..... H10K 19/202; H10K 85/221; H10K 10/50
See application file for complete search history.

(56) References Cited

U.S. PATENT DOCUMENTS

| | | | |
|---|---|---|---|
| 8,014,188 B2 | 9/2011 | Oyasato et al. | |
| 8,941,094 B2 | 1/2015 | Cleavelin et al. | |
| 10,818,687 B2* | 10/2020 | Kim ...................... | H10B 41/27 |
| 2004/0149979 A1 | 8/2004 | Cheong et al. | |
| 2010/0108976 A1 | 5/2010 | Jayasekara et al. | |

(Continued)

FOREIGN PATENT DOCUMENTS

| | | |
|---|---|---|
| KR | 100493166 B1 | 6/2005 |
| KR | 101032502 B1 | 5/2011 |

(Continued)

OTHER PUBLICATIONS

D. Gilmer et al. 'NRAM: A Disruptive Carbon-Nanotube Resistance-Change Memory' *Nanotechnology*, 2018, pp. 1-14.

(Continued)

*Primary Examiner* — Richard A Booth
(74) *Attorney, Agent, or Firm* — Harness, Dickey & Pierce, P.L.C.

(57) ABSTRACT

A variable resistance memory device including a stack including insulating sheets and conductive sheets, which are alternatingly stacked on a substrate, the stack including a vertical hole vertically penetrating therethrough, a bit line on the stack, a conductive pattern electrically connected to the bit line and vertically extending in the vertical hole, and a resistance varying layer between the conductive pattern and an inner side surface of the stack defining the vertical hole may be provided. The resistance varying layer may include a first carbon nanotube electrically connected to the conductive sheets, and a second carbon nanotube electrically connected to the conductive pattern.

20 Claims, 25 Drawing Sheets

(56) References Cited

U.S. PATENT DOCUMENTS

| | | | |
|---|---|---|---|
| 2011/0114894 A1 | 5/2011 | Choi et al. | |
| 2011/0220875 A1 | 9/2011 | Jang | |
| 2012/0145997 A1* | 6/2012 | Hauge | C01B 32/162 |
| | | | 977/932 |
| 2012/0223288 A1 | 9/2012 | Kim et al. | |
| 2013/0134377 A1 | 5/2013 | Park et al. | |
| 2015/0035065 A1 | 2/2015 | Park et al. | |
| 2016/0300885 A1 | 10/2016 | Konevecki et al. | |
| 2017/0077180 A1 | 3/2017 | Ito et al. | |
| 2021/0226122 A1 | 7/2021 | Kim et al. | |

FOREIGN PATENT DOCUMENTS

| | | |
|---|---|---|
| KR | 101129930 B1 | 3/2012 |
| KR | 10-2012-0100630 A | 9/2012 |
| KR | 101611422 B1 | 4/2016 |
| KR | 10-2017-0104861 A | 9/2017 |
| KR | 102144171 B1 | 8/2020 |
| KR | 10-2021-0046526 A | 4/2021 |
| TW | 201027672 A | 7/2010 |

OTHER PUBLICATIONS

Y. You et al. 'Role of remote interfacial phonons in the resistivity of graphene' *Appl. Phys. Lett.*, 115, 2019, pp. 043104-1-043104-4.
C. Dean et al. 'Boron nitride substrates for high-quality graphene electronics' *Nature Nanotechnology*, vol. 5, 2010, pp. 722-726.
S. Ning et al. 'Demonstration and Understanding of Nano-RAM Novel One-Time Programmable Memory Application' *IEEE Transactions on Electron Devices*, vol. 66, No. 5, 2019, pp. 2179-2185.

* cited by examiner

VARIABLE RESISTANCE MEMORY DEVICE

CROSS-REFERENCE TO RELATED APPLICATIONS

This U.S. non-provisional patent application claims priority under 35 U.S.C. § 119 to Korean Patent Application No. 10-2021-0130739, filed on Oct. 1, 2021, in the Korean Intellectual Property Office, the entire contents of which are hereby incorporated by reference.

BACKGROUND

The present disclosure relates to variable resistance memory devices, and in particular, to variable resistance memory devices including a resistance varying layer.

Higher integration of semiconductor devices is required to satisfy consumer demands for superior performance and inexpensive prices. In the case of semiconductor devices, since their integration is a key factor in determining product prices, increased integration is especially required. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. Thus, semiconductor memory devices including three-dimensionally arranged memory cells have recently been proposed.

SUMMARY

An example embodiment of the inventive concepts may provide a variable resistance memory device with improved reliability and increased integration density.

According to an example embodiment of the inventive concepts, a variable resistance memory device may include a stack including insulating sheets and conductive sheets, which are alternatingly stacked on a substrate, the stack including a vertical hole vertically penetrating therethrough, a bit line on the stack, a conductive pattern electrically connected to the bit line and vertically extending in the vertical hole, and a resistance varying layer between the conductive pattern and an inner side surface of the stack defining the vertical hole. The resistance varying layer may include a first carbon nanotube electrically connected to the conductive sheets and a second carbon nanotube electrically connected to the conductive pattern.

According to an example embodiment of the inventive concepts, a variable resistance memory device may include a stack on a substrate and extended in a first direction, the stack including insulating sheets and conductive sheets alternately stacked, the stack including a vertical hole vertically penetrating therethrough, a conductive pattern in a vertical hole penetrating the stack and extending vertically, and a resistance varying layer between the conductive pattern and an inner side surface of the stack defining the vertical hole and extending vertically. The resistance varying layer may include carbon nanotubes electrically connected to at least one of the conductive sheets and the conductive pattern, and a thickness of the resistance varying layer in the first direction may increase as a distance to the substrate decreases.

According to an example embodiment of the inventive concepts, a variable resistance memory device may include a substrate including a cell array region and a connection region, a stack including insulating sheets and conductive sheets, which are alternatingly stacked on the substrate, the stack having pads arranged in a stepwise manner on the connection region, a vertical structure on the cell array region and vertically penetrating the stack, the vertical structure including a conductive pattern and a resistance varying layer, the conductive pattern extending vertically, and a resistance varying layer covering an outer side surface of the conductive pattern, and a lower insulating layer between a top surface of the substrate and a bottom surface of the stack. The lower insulating layer may have a top surface at a level higher than a bottom surface of the vertical structure. A top surface of the lowermost insulating sheet of the insulating sheets may have a surface roughness that is lower than the top surface of the lower insulating layer.

According to an example embodiment of the inventive concepts, a variable resistance memory device may include a lower conductive layer, an upper conductive layer on the lower conductive layer, a resistance varying layer between the lower conductive layer and the upper conductive layer, and a penetration structure provided between the lower conductive layer and the upper conductive layer and penetrating the resistance varying layer. The penetration structure may include an insulating pillar, an insulating sheet enclosing the insulating pillar, and a conductive sheet enclosing the insulating sheet. The resistance varying layer may include carbon nanotubes electrically connected to at least one of the conductive sheet and the upper conductive layer. The insulating sheet may have a first surface facing the insulating pillar and a second surface facing the conductive sheet. The second surface may have a surface roughness that may be lower than the first surface.

DETAILED DESCRIPTION

Example embodiments of the inventive concepts will now be described more fully with reference to the accompanying drawings, in which some example embodiments are shown.

As used herein, expressions such as "at least one of" and "one of" when preceding a list of elements, modify the entire list of elements and do not modify the individual elements of the list. Thus, for example, both "at least one of A, B, or C" and "A, B, and C" means either A, B, C or any combination thereof.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
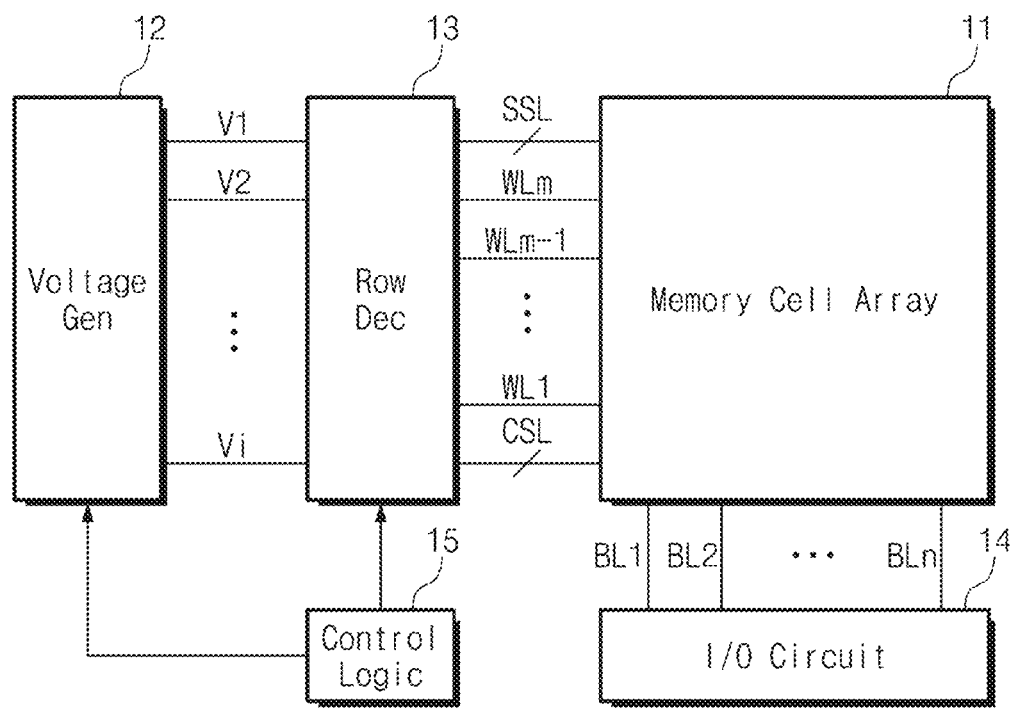
FIG. 1 is a block diagram schematically illustrating a variable resistance memory device according to an example embodiment of the inventive concepts.
Figure 2:
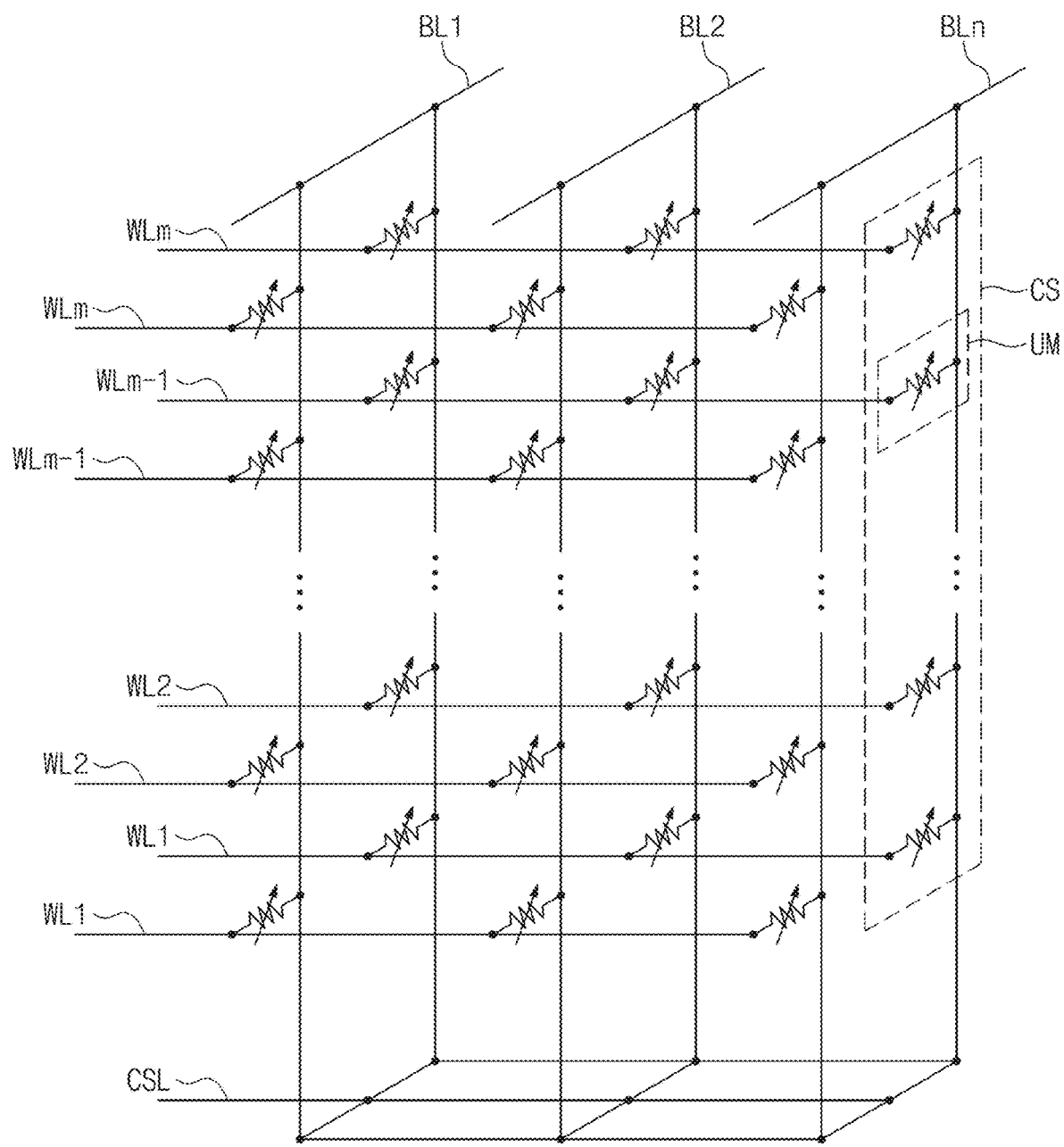
FIG. 2 is a schematic circuit diagram illustrating a variable resistance memory device according to an example embodiment of the inventive concepts.

FIG. 1 is a block diagram schematically illustrating a variable resistance memory device according to an example embodiment of the inventive concepts. FIG. 2 is a schematic circuit diagram illustrating a variable resistance memory device according to an example embodiment of the inventive concepts.

Referring to FIG. 1, a variable resistance memory device may include a memory cell array 11, a voltage generator 12, a row decoder 13, an input/output circuit 14, and a control logic 15. The memory cell array 11 may include a plurality of memory cells, which are disposed at intersections of word lines WL1-WLm and bit lines BL1-BLn, respectively. The memory cell array 11 may include a nonvolatile memory cell. Data in the nonvolatile memory cell may be retained, even when a power voltage is not supplied to the memory cell array 11.

The memory cell array 11 may be connected to the word lines WL1-WLm and the bit lines BL1-BLn. Further, the memory cell array 11 may be connected to one or more string selection lines SSL and one or more common source lines CSL and may include a plurality of portions, each of which is operated as a block, a page, or a cell string.

The voltage generator 12 may be configured to generate word line voltages V1-Vi. The word line voltages V1-Vi may be provided to the row decoder 13. Signals, which will be used for program, read, and erase operations, may be applied to the memory cell array 11 through the bit lines BL1-BLn. Data to be programmed may be provided to the memory cell array 11 through the input/output circuit 14, and readout data may be provided to the outside (e.g., a memory controller) through the input/output circuit 14. The control logic 15 may be configured to provide various control signals, which are associated with operations of the memory device, to the row decoder 13 and the voltage generator 12.

The word line voltages V1-Vi may be provided to the string selection line SSL, the word lines WL1-WLm, and the common source line CSL, depending on a result of a decoding operation of the row decoder 13. For example, the word line voltages V1-Vi may include a string selection voltage, a word line voltage, and a ground selection voltage. The string selection voltage may be provided to one or more string selection lines SSL, the word line voltage may be provided to one or more word lines WL1-WLm, and the ground selection voltage may be provided to one or more common source lines CSL.

Referring to FIG. 2, the variable resistance memory device may include the word lines WL1-WLm, the bit lines BL1-BLn, the common source line CSL, and the cell strings CS. The word lines WL1-WLm and the bit lines BL1-BLn may be extended in two different directions to cross each other. The word lines WL1-WLm may be extended in a first direction D1, and the bit lines BL1-BLn may be extended in a second direction D2.

The cell strings CS may be connected in parallel to each of the bit lines BL1-BLn. The cell strings CS may be connected in common to the common source line CSL. That is, the cell strings CS may be disposed between the bit lines BL1-BLn and the common source line CSL. Each of the cell strings CS may include unit memory cells UM which are located at vertically various levels. The unit memory cells UM may be arranged in a third direction D3, which is not parallel to extension directions of the word and bit lines WL1-WLm and BL1-BLn. Each of the unit memory cells UM may include a variable resistor. The unit memory cells UM, which are included in different ones of the cell strings CS and are located at the same vertical level, may be connected in common to one of the word lines WL1-WLm. A resistance of each of the unit memory cells UM may be changed by electric signals, which are provided through corresponding ones of the word and bit lines WL1-WLm and BL1-BLn. In addition, each of the unit memory cells UM may output a resistance value through corresponding ones of the word and bit lines WL1-WLm and BL1-BLn.

Figure 3:
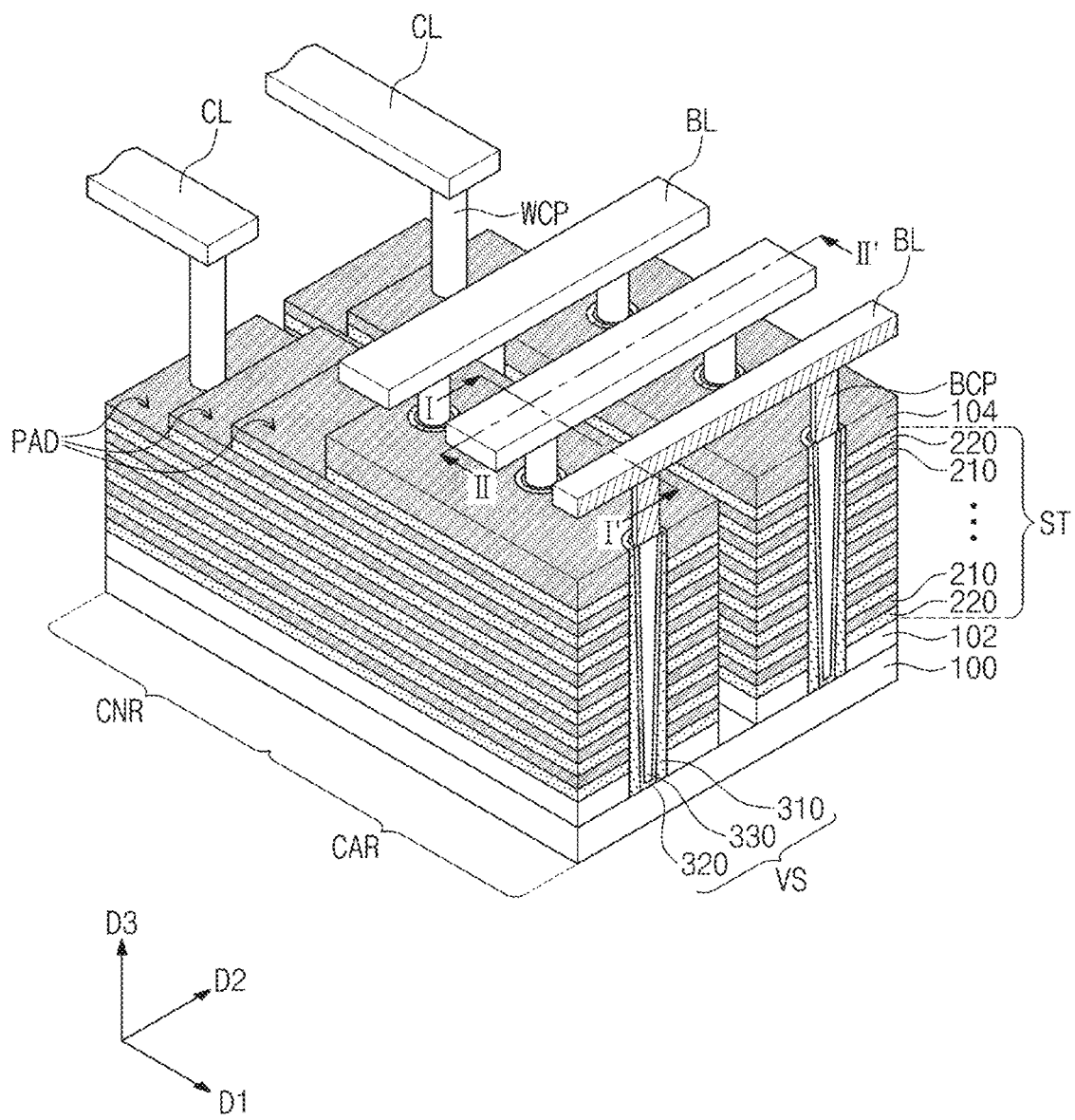
FIG. 3 is a perspective view illustrating a variable resistance memory device according to an example embodiment of the inventive concepts.
Figure 4A:
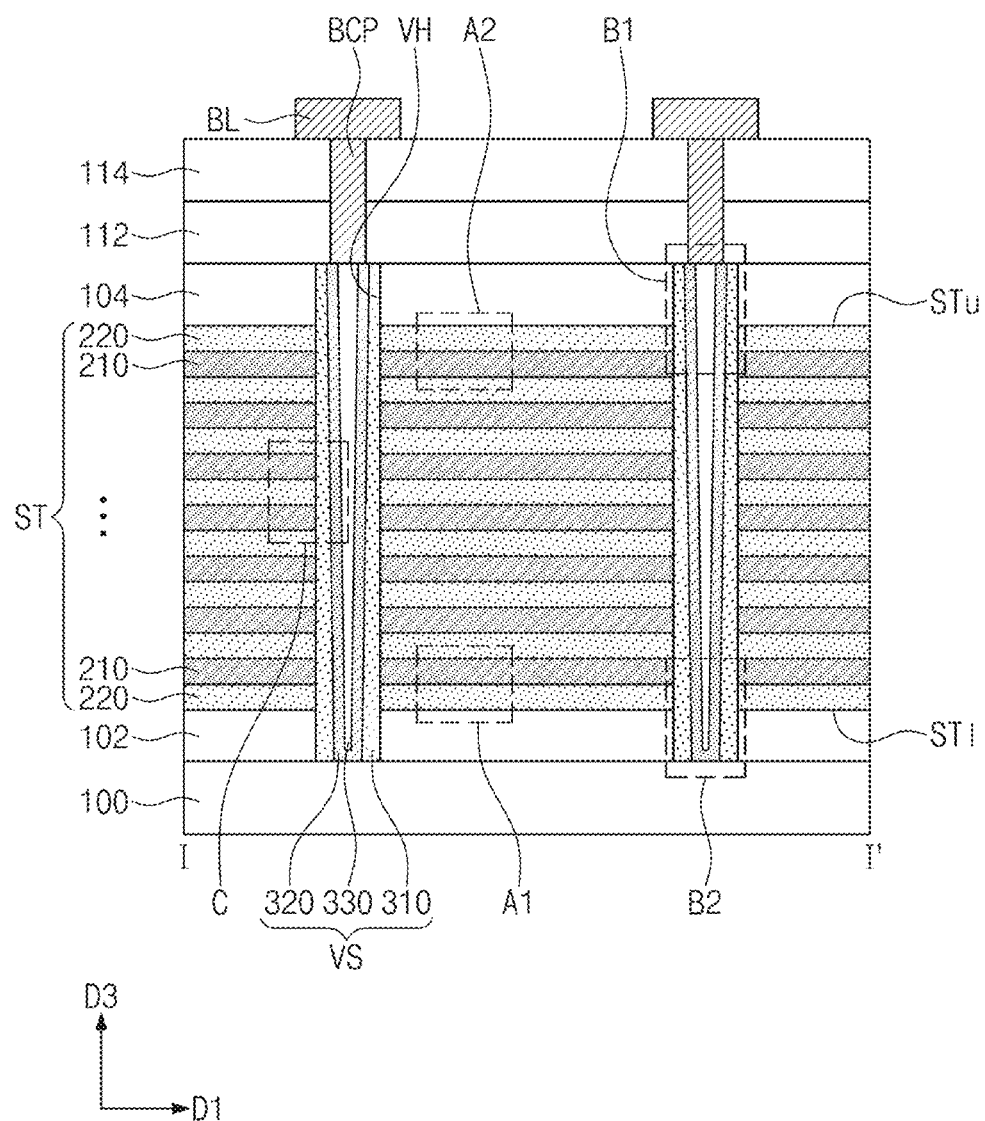
FIGS. 4A and 4B are sectional views which are respectively taken along lines I-I' and II-II' of FIG. 3 to illustrate a variable resistance memory device according to an example embodiment of the inventive concepts.
Figure 4B:
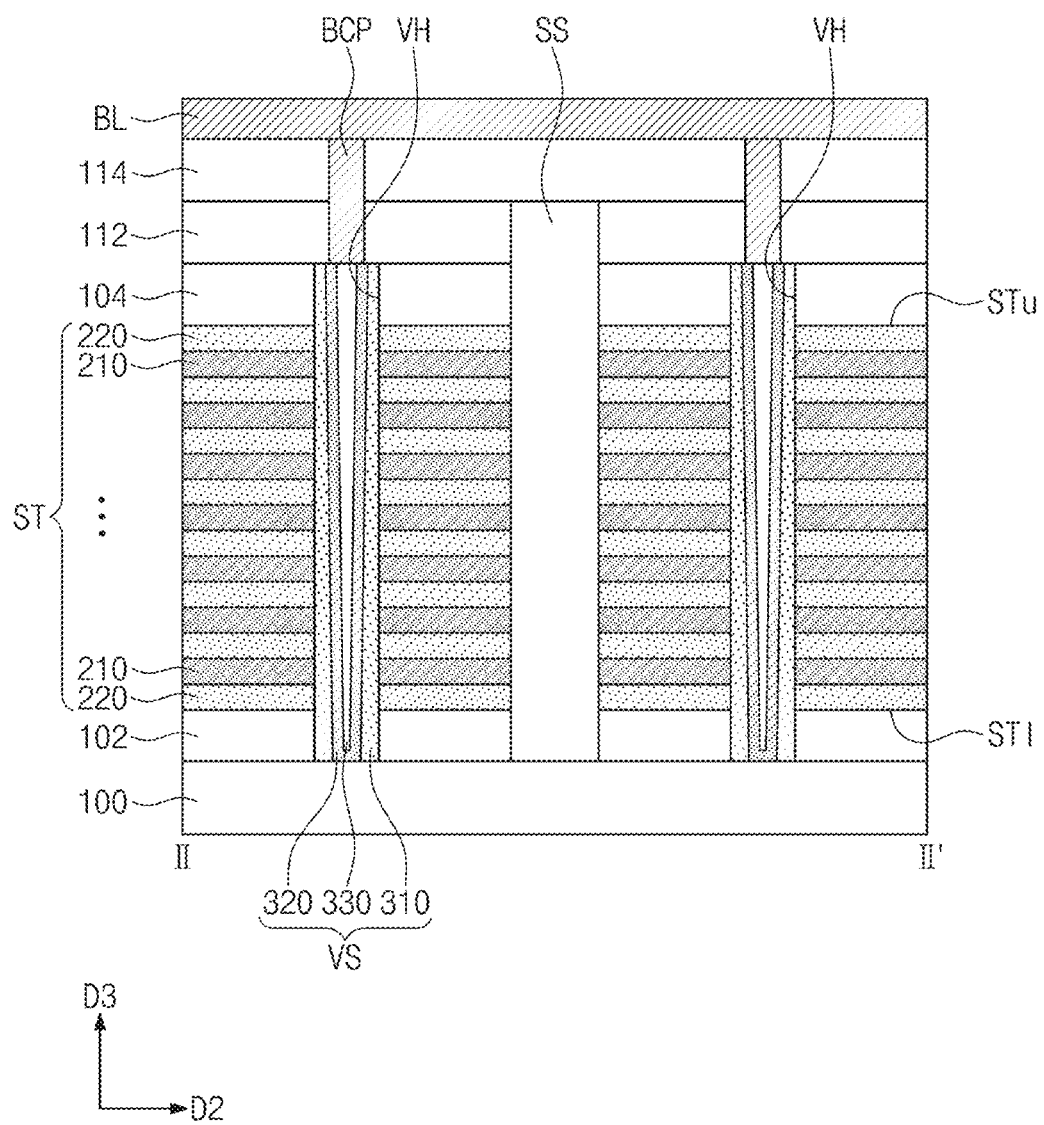

FIG. 3 is a perspective view illustrating a variable resistance memory device according to an example embodiment of the inventive concepts. FIGS. 4A and 4B are sectional views which are taken along lines I-I' and II-II' of FIG. 3, respectively, to illustrate a variable resistance memory device according to an example embodiment of the inventive concepts.

Referring to FIGS. 3, 4A, and 4B, a semiconductor device according to an example embodiment of the inventive concepts may include a substrate 100, stacks ST on the substrate 100, conductive lines CL connected to the stacks ST, vertical structures VS penetrating the stacks ST, and bit lines BL connected to the vertical structures VS.

The substrate 100 may include a cell array region CAR and a connection region CNR, which are arranged in the first direction D1. The cell strings CS described with reference to FIG. 2 may be formed on the cell array region CAR. Interconnection lines, which connect the word lines WL1-WLm or the cell strings CS to the decoders, may be formed on the connection region CNR. The substrate 100 may have a top surface, which is extended in the first and second directions D1 and D2 that are perpendicular to each other. The substrate 100 may have a specific conductivity type and may include the common source line CSL described with reference to FIG. 2. For example, the substrate 100 may be configured to receive a ground voltage and to supply the ground voltage to the vertical structures VS. The substrate 100 may be formed of or include a semiconductor material. The substrate 100 may be formed of or include at least one of silicon (Si), germanium (Ge), silicon germanium (SiGe), gallium arsenic (GaAs), indium gallium arsenic (InGaAs), or aluminum gallium arsenic (AlGaAs). The substrate 100 may be formed of or include a doped semiconductor material of a first conductivity type and/or an undoped or intrinsic semiconductor material. The first conductivity type may be, for example, n-type. The substrate 100 may have one of polycrystalline, amorphous, and single-crystalline structures.

The stacks ST may be disposed on the substrate 100. The stacks ST may extend in the first direction D1 and parallel to each other and may be spaced apart from each other in the second direction D2. Each of the stacks ST may be placed on the cell array region CAR and the connection region CNR. The stacks ST may have a stepwise structure on the connection region CNR. The stacks ST may have pads PAD located at different vertical levels.

Each of the stacks ST may include conductive sheets 210 and insulating sheets 220, which are stacked in a direction perpendicular to the top surface of the substrate 100. The conductive sheets 210 and the insulating sheets 220 may be alternately disposed in the third direction D3. A space between the stacks ST may be filled with a separation structure SS, as shown in FIG. 4B. The separation structure SS may be formed of or include at least one of insulating materials (e.g., silicon oxide, silicon nitride, or silicon oxynitride). The separation structure SS may separate the conductive sheets 210, which are provided in one of the stacks ST, from the conductive sheets 210, which are provided in a neighboring one of the stacks ST, and in this case, the stacks ST may be independently controlled. Hereinafter, a variable resistance memory device according to an example embodiment of the inventive concepts will be described in more detail with reference to one of the stacks ST.

The conductive sheets 210 may be formed of or include a two-dimensional material containing carbon atoms. The conductive sheets 210 may be formed of or include graphene. For example, the conductive sheets 210 may include a polycyclic aromatic molecule, in which a plurality of carbon atoms are connected by covalent bonds. The carbon atoms, which are included in the graphene and are connected by covalent bonds, may have one of pentagon, hexagon, and heptagon rings as the basic repeating unit. The conductive sheets 210 may include at least one single-atomic-layered graphene, in which carbon atoms are connected by covalent bonds (e.g., $sp^2$ bonding) to form a single atomic layer. The single-atomic-layered graphene may have a thickness ranging from 0.01 nm to 3 nm. In an example embodiment, the conductive sheets 210 may include a mono-layered graphene, in which graphene is provided in a single-atomic-layered structure. In an example embodiment, the conductive sheets 210 may include one of a dual-layered graphene, which contains two layers of single-atomic-layered graphene, and a triple-layered graphene, which contains three layers of single-atomic-layered graphene. The conductive sheets 210 may have a thickness ranging from 0.01 nm to 10 nm.

The insulating sheets 220 may be formed of or include hexagonal boron nitride (h-BN). The hexagonal boron nitride may be a material that has a two-dimensional structure and includes boron and nitrogen atoms arranged in the form of a hexagonal ring. The hexagonal boron nitride may have a lattice constant that is close to the graphene. The bonding between the boron and nitrogen atoms in the hexagonal boron nitride may be a $sp^2$ covalent bond. The insulating sheets 220 may include at least one single-atomic-layered hexagonal boron nitride provided in the form of a single atomic layer. In an example embodiment, the insulating sheets 220 may include a plurality of single-atomic-layered hexagonal boron nitrides.

The insulating sheets 220 may be located at the uppermost and lowermost levels of the stack ST. That is, the stack ST may have a top surface STu and a bottom surface ST1 that are defined by the insulating sheets 220. The insulating sheets 220 may be provided such that each of the conductive sheets 210 is interposed between a pair of insulating sheets of the insulating sheets 220 in a vertical direction. On the cell array region CAR, the insulating sheets 220 may not expose surfaces of the conductive sheets 210 other than the side surfaces. For example, the uppermost one of the insulating sheets 220 may be placed on a top surface of the uppermost one of the conductive sheets 210. The lowermost one of the insulating sheets 220 may be placed under a bottom surface of the lowermost one of the conductive sheets 210. The insulating sheets 220 may have the same thickness, regardless of vertical positions thereof. The conductive sheets 210 may have the same thickness, regardless of vertical positions thereof. In an example embodiment, the thicknesses of the insulating sheets 220 may be equal to the thicknesses of the conductive sheets 210. For example, the insulating sheets 220 may have a thickness ranging from 0.01 nm to 10 nm.

A lower insulating layer 102 may be provided between the top surface of the substrate 100 and the bottom surface ST1 of the stack ST. In other words, the stack ST may be spaced apart from the substrate 100 with the lower insulating layer 102 interposed therebetween. The lower insulating layer 102 may not cover the entire top surface of the substrate 100. A width of the lower insulating layer 102 in the second direction D2 may be equal to that of the stack ST, as shown in FIG. 4B, and the lower insulating layer 102 may provide isolation between the bottom surface of the stack ST and the top surface of the substrate 100. The lower insulating layer 102 may be formed of or include at least one of, for example, silicon oxide or silicon oxynitride. A thickness of the lower insulating layer 102 may be larger than a thickness of the conductive sheet 210 and a thickness of the insulating sheet 220.

An upper insulating layer 104 may be provided on the top surface STu of the stack ST. A width of the upper insulating layer 104 in the second direction D2 may be equal to that of the stack ST. The upper insulating layer 104 may fully cover the top surface of the stack ST (e.g., a top surface of the uppermost insulating pattern 220). The upper insulating layer 104 may be formed of or include at least one of, for example, silicon oxide or silicon oxynitride. A thickness of the upper insulating layer 104 may be thicker than the thickness of the conductive sheet 210 and the thickness of the insulating sheet 220.

The upper and lower insulating layers 104 and 102 may have an oxygen concentration that is higher than the insulating sheets 220. For example, the insulating sheets 220 may not include an oxygen atom. The insulating sheets 220 may block or prevent the upper and lower insulating layers 104 and 102 from being in contact with the conductive sheets 210 and thus may prevent oxygen atoms in the upper and lower insulating layers 104 and 102 from infiltrating into the graphene in the conductive sheets 210.

Figure 5A:
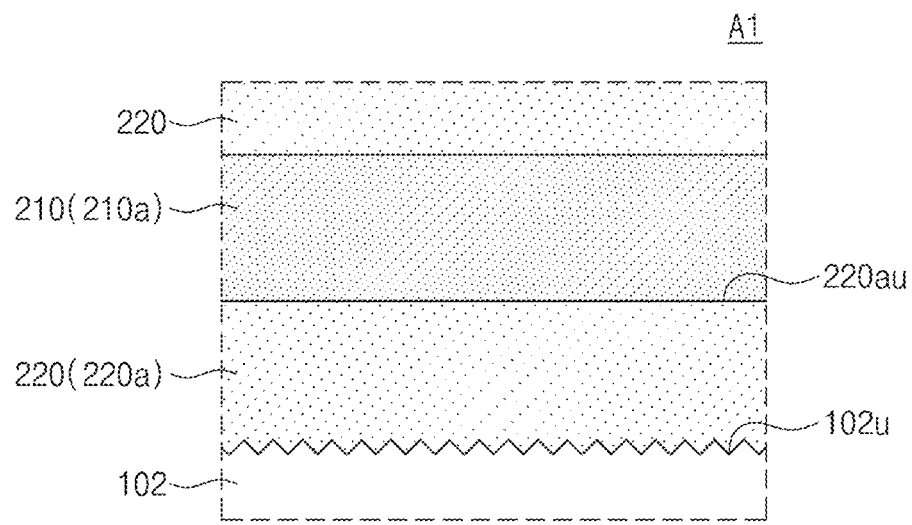
FIGS. 5A and 5B are enlarged sectional views illustrating portions (e.g., 'A1' and 'A2' of FIG. 4A) of a variable resistance memory device according to an example embodiment of the inventive concepts.
Figure 5B:
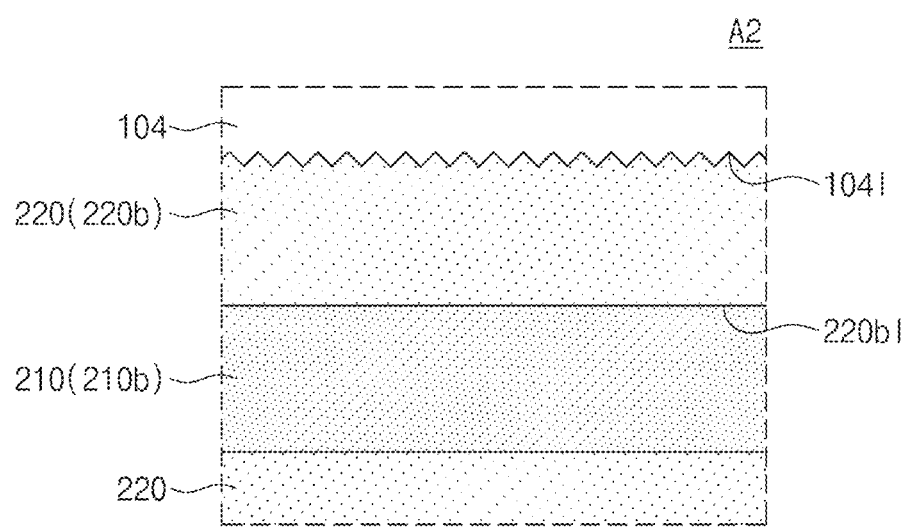

FIGS. 5A and 5B are enlarged sectional views illustrating portions (e.g., 'A1' and 'A2' of FIG. 4A) of a variable resistance memory device according to an example embodiment of the inventive concepts.

Referring to FIGS. 4A and 5A, the lowermost insulating sheet 220a of the insulating sheets 220 may be positioned between a top surface 102u of the lower insulating layer 102 and a bottom surface of the lowermost conductive sheet 210a. The top surface 102u of the lower insulating layer 102 may have a non-uniform surface roughness. The lowermost insulating sheet 220a may cover the top surface 102u of the lower insulating layer 102 and to mitigate or prevent deterioration in electric characteristics of the conductive sheets 210, which may be caused by the nonuniform surface of the lower insulating layer 102. A top surface 220au of the lowermost insulating sheet 220a may have a surface roughness that is lower than the top surface 102u of the lower insulating layer 102 and a bottom surface of the lowermost insulating sheet 220a. The lowermost conductive sheet 210a may be directly disposed on the top surface 220au of the lowermost insulating sheet 220a. Because the conductive sheets 210 are directly disposed on a surface of a low surface roughness, charge mobility (e.g., electron mobility) of the variable resistance memory device may be improved.

Referring to FIGS. 4A and 5B, the uppermost insulating sheet 220b of the insulating sheets 220 may be positioned between a bottom surface 104l of the upper insulating layer 104 and a top surface of the uppermost conductive sheet 210b. A bottom surface 220bl of the uppermost insulating sheet 220b may have a surface roughness that is lower than the bottom surface 104l of the upper insulating layer 104 and a top surface of the uppermost insulating sheet 220b. The uppermost conductive sheet 210b may be directly disposed on the bottom surface 220bl of the uppermost insulating sheet 220b.

Referring back to FIGS. 3, 4A, and 4B, vertical structures VP may be provided in vertical holes VH, which vertically penetrate the stack ST. The vertical structures VP may be disposed on the cell array region CAR of the substrate 100. The vertical structures VP may penetrate the upper insulating layer 104, the stack ST, and the lower insulating layer 102 and may be connected to the substrate 100. In an example embodiment, the vertical structures VP penetrating each stack ST may be arranged in the first direction D1. Each of the vertical structures VP may include a resistance varying layer 310, a conductive pattern 320, and a gapfill insulating pattern 330.

The resistance varying layer 310 may be positioned between the conductive pattern 320 and an inner side surface of the stack ST defining the vertical hole VH. The resistance varying layer 310 may vertically extend to cover an outer side surface of the conductive pattern 320. The resistance varying layer 310 may cover the inner side surface of the stack ST defining the vertical hole VH. The resistance varying layer 310 may be in contact with side surfaces of the conductive sheets 210 and side surfaces of the insulating sheets 220, which are exposed through the inner side surface of the stack ST defining the vertical hole VH. In an example embodiment, the resistance varying layer 310 may have a pipe shape. The resistance varying layer 310 may be configured to have an electric resistance that can be changed by electric signals applied to a conductive line CL and the bit line BL. For example, the resistance varying layer 310 may be changed from a low resistance state to a high resistance state or from a high resistance state to a low resistance state, depending on voltages applied to the conductive sheet 210 and the conductive pattern 320. The resistance varying layer 310 may include carbon nanotubes (CNT). The carbon nanotubes of the resistance varying layer 310 may be electrically connected to at least one of the conductive sheet 210 and the conductive pattern 320. A change in resistance of the resistance varying layer 310 may be achieved by displacement of carbon nanotubes in the resistance varying layer 310. The carbon nanotubes of the resistance varying layer 310 may include one of a single-walled carbon nanotube (SWCNT) and a double-walled carbon nanotube (DWCNT). A change in resistance of the resistance varying layer 310 will be described in more detail with reference to FIGS. 7A and 7B.

Figure 6A:
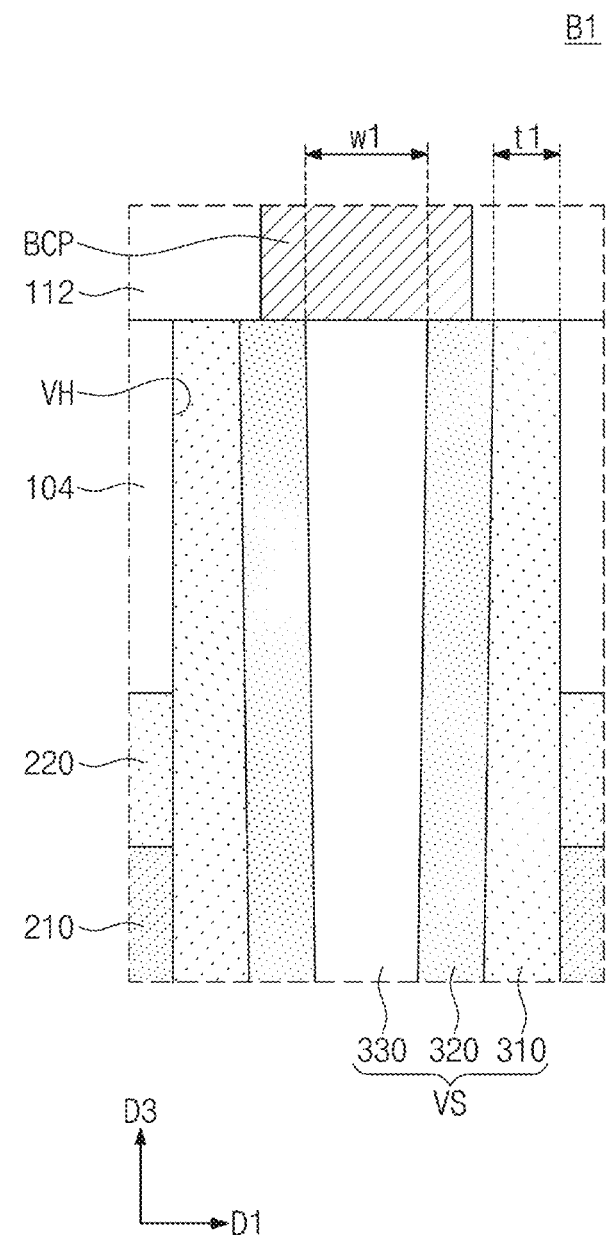
FIGS. 6A and 6B are enlarged sectional views illustrating portions (e.g., 'B1' and 'B2' of FIG. 4A) of a variable resistance memory device according to an example embodiment of the inventive concepts.
Figure 6B:
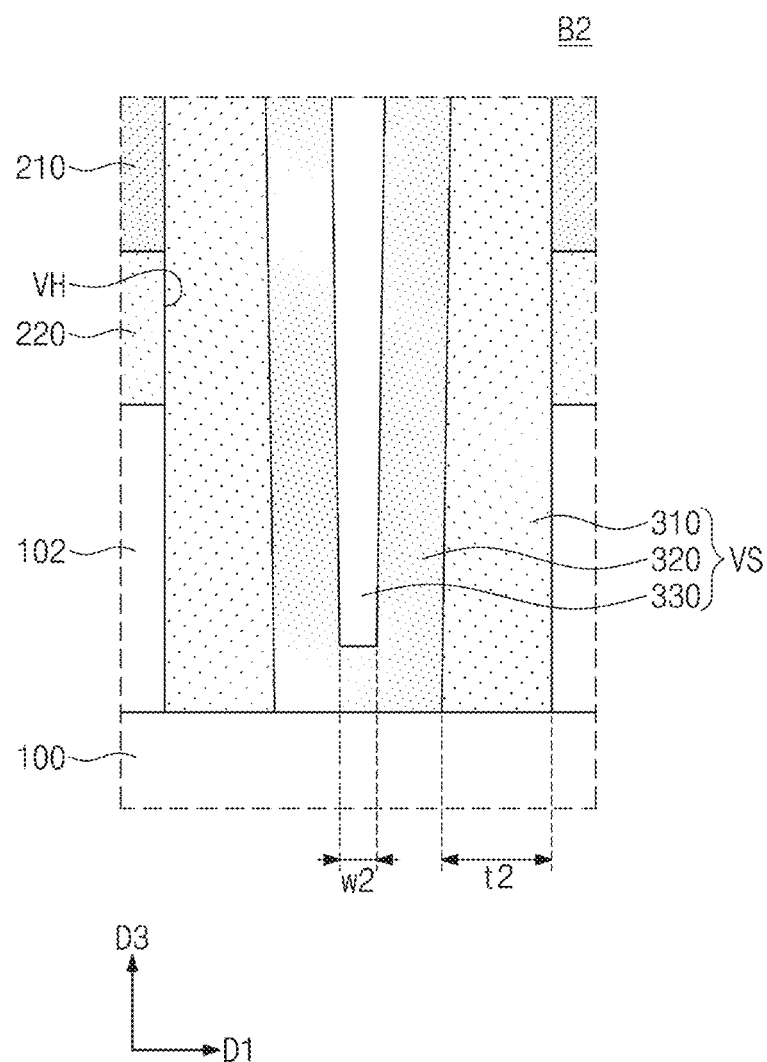

FIGS. 6A and 6B are enlarged sectional views illustrating portions (e.g., 'B1' and 'B2' of FIG. 4A) of a variable resistance memory device according to an example embodiment of the inventive concepts.

Referring to FIGS. 4A, 6A, and 6B, a thickness of the resistance varying layer 310 may increase as a distance to the substrate 100 decreases. The thickness of the resistance varying layer 310 may mean a horizontal distance between an outer side surface of the resistance varying layer 310, which faces an inner side surface of the stack ST defining the vertical hole VH, and an inner side surface of the resistance varying layer 310, which faces the conductive pattern 320. For example, as shown in FIGS. 6A and 6B, a thickness of the resistance varying layer 310 in the first direction D1 may gradually increase as a distance to the substrate 100 decreases. A thickness t2 of a bottom end of the resistance varying layer 310 may be larger than a thickness t1 of a top end of the resistance varying layer 310.

The conductive pattern 320 may be vertically extended in the vertical hole VH and may be electrically connected to the bit line BL through a bit line contact plug BCP. The conductive pattern 320 may conformally cover the inner side surface of the resistance varying layer 310. The conductive pattern 320 may have a uniform thickness, unlike the thickness of the resistance varying layer 310. The conductive pattern 320 may cover the top surface of the substrate 100 and may be in direct contact with the top surface of the substrate 100. The conductive pattern 320 may be provided in a half-opened shape with open top end and closed bottom end. The conductive pattern 320 may include graphene. In an example embodiment, the conductive pattern 320 may include a mono-layered graphene containing one single-atomic-layered graphene. In an example embodiment, the conductive pattern 320 may include one of a dual-layered graphene, which contains two layers of single-atomic-layered graphene, and a triple-layered graphene, which contains three layers of single-atomic-layered graphene.

The gapfill insulating pattern 330 may be vertically extended, in the vertical hole VH. The gapfill insulating pattern 330 may fill a remaining portion of the vertical hole VH which is partially filled with the resistance varying layer 310 and the conductive pattern 320. The gapfill insulating pattern 330 may cover an inner side surface of the conductive pattern 320. A top end of the gapfill insulating pattern 330 may be located at the same level as a top end of the resistance varying layer 310 and a top end of the conductive pattern 320. The top end of the gapfill insulating pattern 330 may be covered with the bit line contact plug BCP. The gapfill insulating pattern 330 may be formed of or include at least one of, for example, silicon oxide or silicon nitride. A width of the gapfill insulating pattern 330 may decrease as a distance to the substrate 100 decreases. For example, a width w1 of the top end of the gapfill insulating pattern 330 may be larger than a width w2 of a bottom end of the gapfill insulating pattern 330.

Figure 7A:
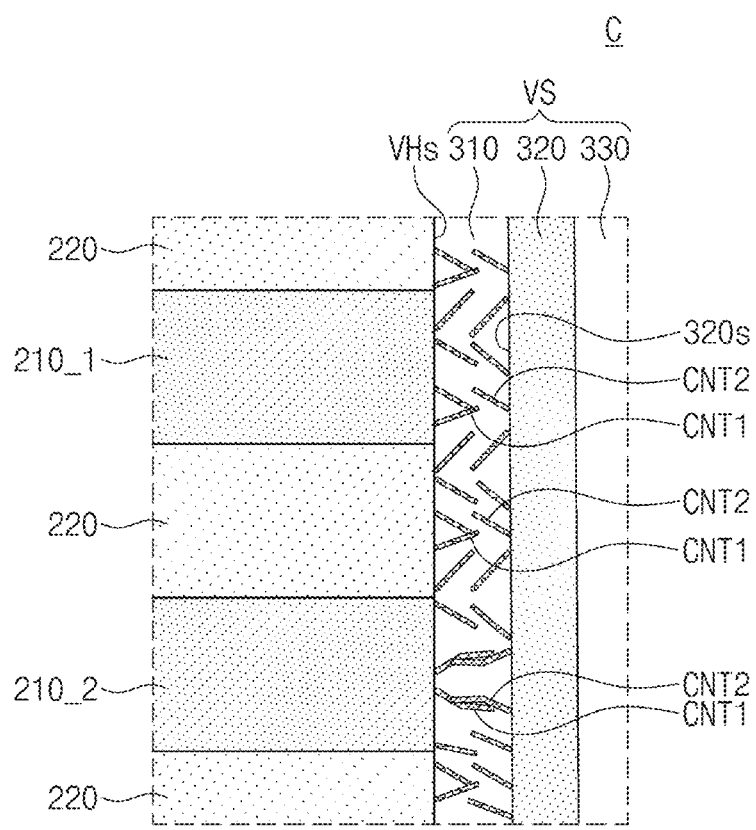
FIGS. 7A and 7B are enlarged sectional views, each of which illustrates a portion 'C' of FIG. 4A.
Figure 7B:
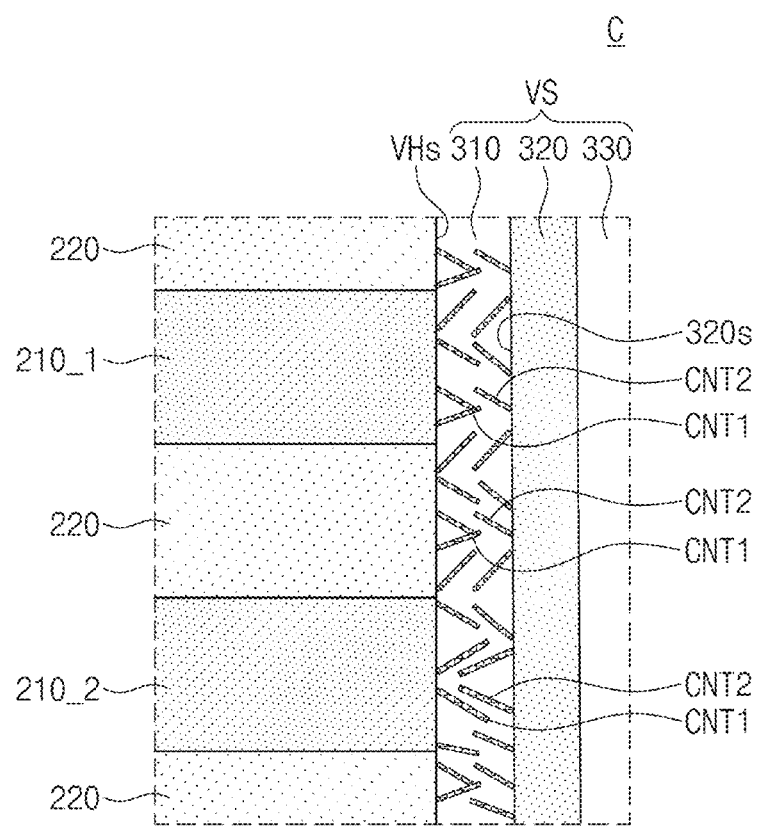

FIGS. 7A and 7B are enlarged sectional views, each of which illustrates a portion 'C' of FIG. 4A.

Referring to FIGS. 4A and 7A, the resistance varying layer 310 may include first carbon nanotubes CNT1, which are adjacent to an inner side surface VHs of the stack ST defining the vertical hole VH, and second carbon nanotubes CNT2, which are adjacent to a side surface 320s of the conductive pattern 320. The first carbon nanotubes CNT1 may be fastened to side surfaces of the conductive sheets 210 and the insulating sheets 220. Some of the first carbon nanotubes CNT1 may be electrically connected to the conductive sheets 210. The second carbon nanotubes CNT2 may be fastened to the side surface 320s of the conductive pattern 320 and may be electrically connected to the conductive pattern 320. Some of the first carbon nanotubes CNT1 may be on side surfaces of the insulating sheets 220 and may be electrically disconnected from the conductive sheets 210 and the conductive pattern 320.

An electric resistance (hereinafter, resistance) of the resistance varying layer 310 may be locally controlled, based on the disposition and connection of the first and second carbon nanotubes CNT1 and CNT2. For example, some of the first and second carbon nanotubes CNT1 and CNT2, which are located between the conductive sheets 210 and the conductive pattern 320, may be connected to or disconnected from each other, and this may be used to control a resistance of the resistance varying layer 310 in a horizontal direction. For example, the first carbon nanotubes CNT1, which are electrically connected to a first conductive sheet 210_1 of the conductive sheet 210, may be electrically disconnected from the second carbon nanotubes CNT2. By contrast, the first carbon nanotubes CNT1, which are electrically connected to a second conductive sheet 210_2 of the conductive sheet 210, may be electrically connected to some of the second carbon nanotubes CNT2. Thus, a resistance between the second conductive sheet 210_2 and the conductive pattern 320 may be smaller than a resistance between the first conductive sheet 210_1 and the conductive pattern 320.

Referring to FIGS. 4A, 7A, and 7B, the variable resistance memory device according to an example embodiment of the inventive concepts may be configured to execute a data write operation through localized control of the resistance of the resistance varying layer 310. Data in the variable resistance memory device may be determined by measuring a resistance between each of the conductive sheets 210 and the conductive pattern 320.

The data writing operation on the resistance varying layer 310 may include a set operation of bringing the first and second carbon nanotubes CNT1 and CNT2, which are separated from each other, into contact with each other and a reset operation of separating the first and second carbon nanotubes CNT1 and CNT2, which are in contact with each other. In an example embodiment, the set and reset operations may be independently performed between each of the conductive sheets 210 and the conductive pattern 320.

The set operation may include applying the ground voltage to the conductive pattern 320 and selectively applying a set voltage to the conductive sheet 210 to be set. For example, the set voltage may be selectively applied to the second conductive sheet 210_2. The first carbon nanotubes CNT1, which are electrically connected to the second conductive sheet 210_2, may come close to the second carbon nanotubes CNT2 adjacent thereto by an electrostatic force produced by the set voltage. The first and second carbon nanotubes CNT1 and CNT2, which are sufficiently close to each other by the electrostatic force, may contact each other by the van der Waals force. The first and second carbon nanotubes CNT1 and CNT2 may be bent by an electrostatic force and a van der Waals force, as shown in FIG. 7A.

The reset operation may include applying the ground voltage to one of the conductive pattern 320 and the conductive sheet 210 and repeatedly producing a potential difference between the conductive pattern 320 and the conductive sheet 210. Voltages, which are applied to the conductive pattern 320 and the conductive sheet 210, respectively, may cause a charge variation in the first and second carbon nanotubes CNT1 and CNT2. The repetition of the charge variation may lead to mechanical oscillation of the first and second carbon nanotubes CNT1 and CNT2 and thus may separate the first and second carbon nanotubes CNT1 and CNT2 from each other. In this case, the first and second carbon nanotubes CNT1 and CNT2, which are bent by the electrostatic force and the van der Waals force, may be restored to their original (e.g., unbent) states by their own elastic forces.

The voltages for the set and reset operations may be determined depending on an elastic modulus of the carbon nanotubes. In the case where the carbon nanotubes are prepared to have a proper elastic modulus, it may be possible to improve electric reliability in the set and reset operations. In an example embodiment, each of the first and second carbon nanotubes CNT1 and CNT2 may include one of a single-walled carbon nanotube (SWCNT) and a double-walled carbon nanotube (DWCNT).

Referring back to FIGS. 3, 4A, and 4B, a first interlayer insulating layer 112 and a second interlayer insulating layer 114 may be sequentially stacked on the upper insulating layer 104. The first interlayer insulating layer 112 may cover a top surface of the upper insulating layer 104 and may cover a portion of a top surface of the vertical structure VS. The first interlayer insulating layer 112 may cover a portion (e.g., a top portion) of a side surface of the separation structure SS. A top surface of the first interlayer insulating layer 112 may be located at the same vertical level as a top surface of the separation structure SS. The second interlayer insulating layer 114 may cover the top surface of the first interlayer insulating layer 112 and the top surface of the separation structure SS. The first and second interlayer insulating layers 112 and 114 may be formed of or include at least one of, for example, silicon oxide, silicon oxynitride, or silicon nitride. In an example embodiment, the first and second interlayer insulating layers 112 and 114 may be formed of or include the same material, and there may be no observable interface therebetween.

The bit lines BL may be provided on the stack ST of the cell array region CAR. In an example embodiment, the bit lines BL may be located on the top surface STu of the stack ST. The bit lines BL may be connected to the vertical structure VS through bit line contact plugs BCP, which are formed to penetrate the first and second interlayer insulating layers 112 and 114. The bit line contact plugs BCP may electrically connect the bit lines BL to the conductive pattern 320. Each of the bit line contact plugs BCP may fully cover a top surface of the gapfill insulating pattern 330 and to at least partially cover a top surface of the conductive pattern 320. The bit lines BL may be arranged in the first direction D1 and may be extended in the second direction D2 and parallel to each other. Each of the bit lines BL may be connected in common to corresponding vertical structures VS penetrating different ones of the stacks ST, respectively.

Referring back to FIG. 3, the conductive lines CL may be provided on the connection region CNR and may overlap the stack ST. In an example embodiment, the conductive lines CL may be extended in the first direction D1. The conductive lines CL may be connected to the conductive sheets 210 of the stack ST through word line contact plugs WCP, which vertically extend. Each of the conductive lines CL may be connected to a corresponding one of the conductive sheets 210 in a one-to-one manner Each of the conductive sheets 210 may receive an operation voltage independently through a corresponding one of the conductive lines CL. In an example embodiment, the conductive lines CL may be located at the same level, and the word line contact plugs WCP may have various lengths, depending on vertical positions of the conductive sheets 210 connected thereto.

For example, each of the conductive sheets 210 may have a partially exposed top surface on the connection region CNR, and the pads PAD of the stack ST may be defined by the exposed top surfaces of the conductive sheets 210. Each of the conductive lines CL may be electrically connected to a corresponding one of the pads PAD through the word line contact plug WCP. FIG. 3 illustrates an example, in which two conductive lines CL and two word line contact plugs WCP are provided, but the numbers of the conductive lines CL and the word line contact plugs WCP are not limited to this example. For example, the numbers of the conductive lines CL and the word line contact plugs WCP, which are provided in the variable resistance memory device, may be equal to the number of the pads PAD.

Figure 8:
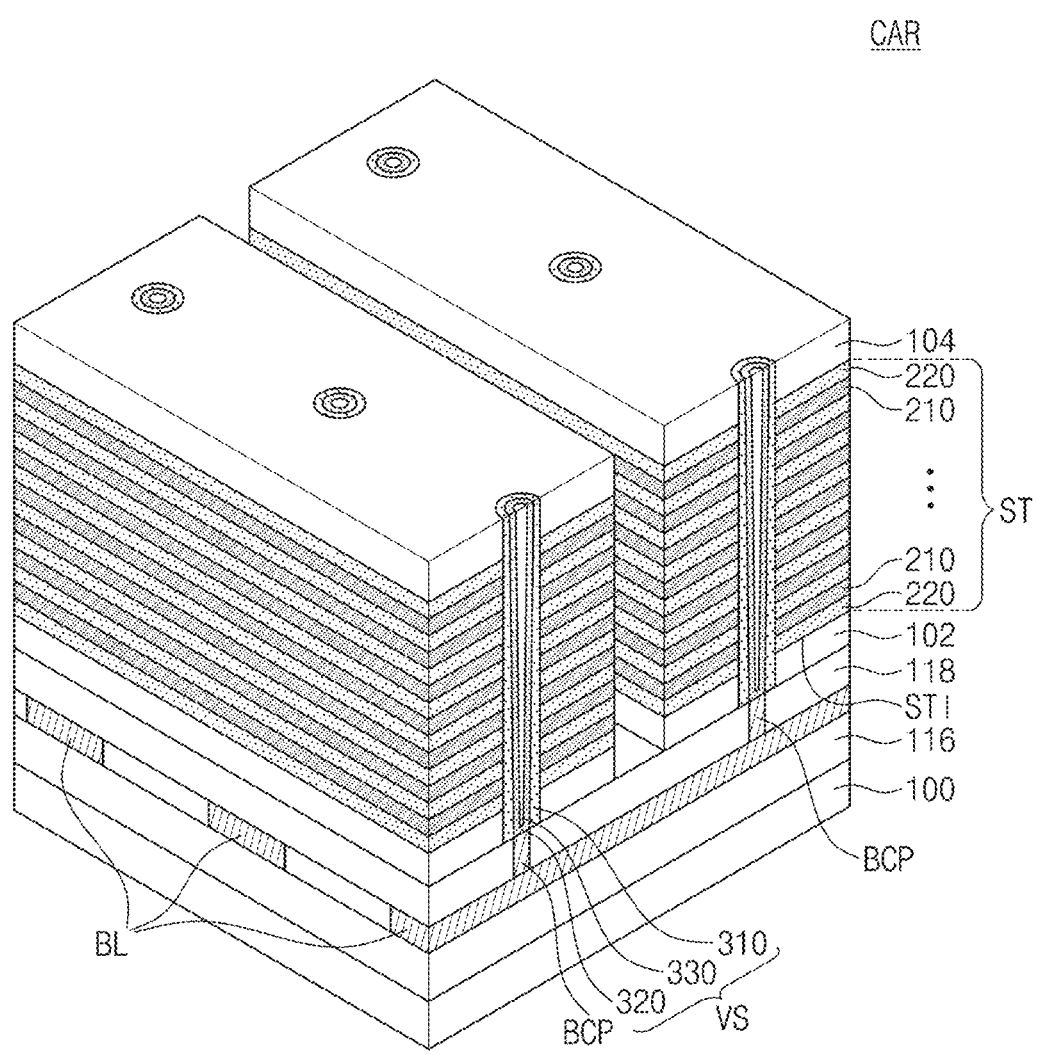
FIG. 8 is a perspective view illustrating a cell array region of a variable resistance memory device according to an example embodiment of the inventive concepts.

FIG. 8 is a perspective view illustrating a cell array region of a variable resistance memory device according to an example embodiment of the inventive concepts. For concise description, previously described elements may be identified by the same reference numbers without repeating overlapping descriptions thereof.

Referring to FIG. 8, the bit lines BL may be placed below the bottom surfaces ST1 of the stack ST. For example, a first lower interlayer insulating layer 116 may be provided on the top surface of the substrate 100. The first lower interlayer insulating layer 116 may cover the entire top surface of the substrate 100. The bit lines BL may be arranged in the first direction D1 on a top surface of the first lower interlayer insulating layer 116 and may be extended in the second direction D2 and parallel to each other. The bit lines BL may be covered with a second lower interlayer insulating layer 118. The first and second lower interlayer insulating layers 116 and 118 may be formed of or include at least one of insulating materials (e.g., silicon oxide, silicon nitride, or silicon oxynitride). In an example embodiment, the first and second lower interlayer insulating layers 116 and 118 may be formed of the same material, and there may be no observable interface therebetween.

The bit line contact plug BCP may penetrate the second lower interlayer insulating layer 118 and to electrically connect the bit line BL to the conductive pattern 320. The bit line contact plug BCP may be provided between a top surface of the bit line BL and a bottom end of the conductive pattern 320 and extend in the third direction D3 and be in direct contact with the bottom end of the conductive pattern 320.

Figure 9A:
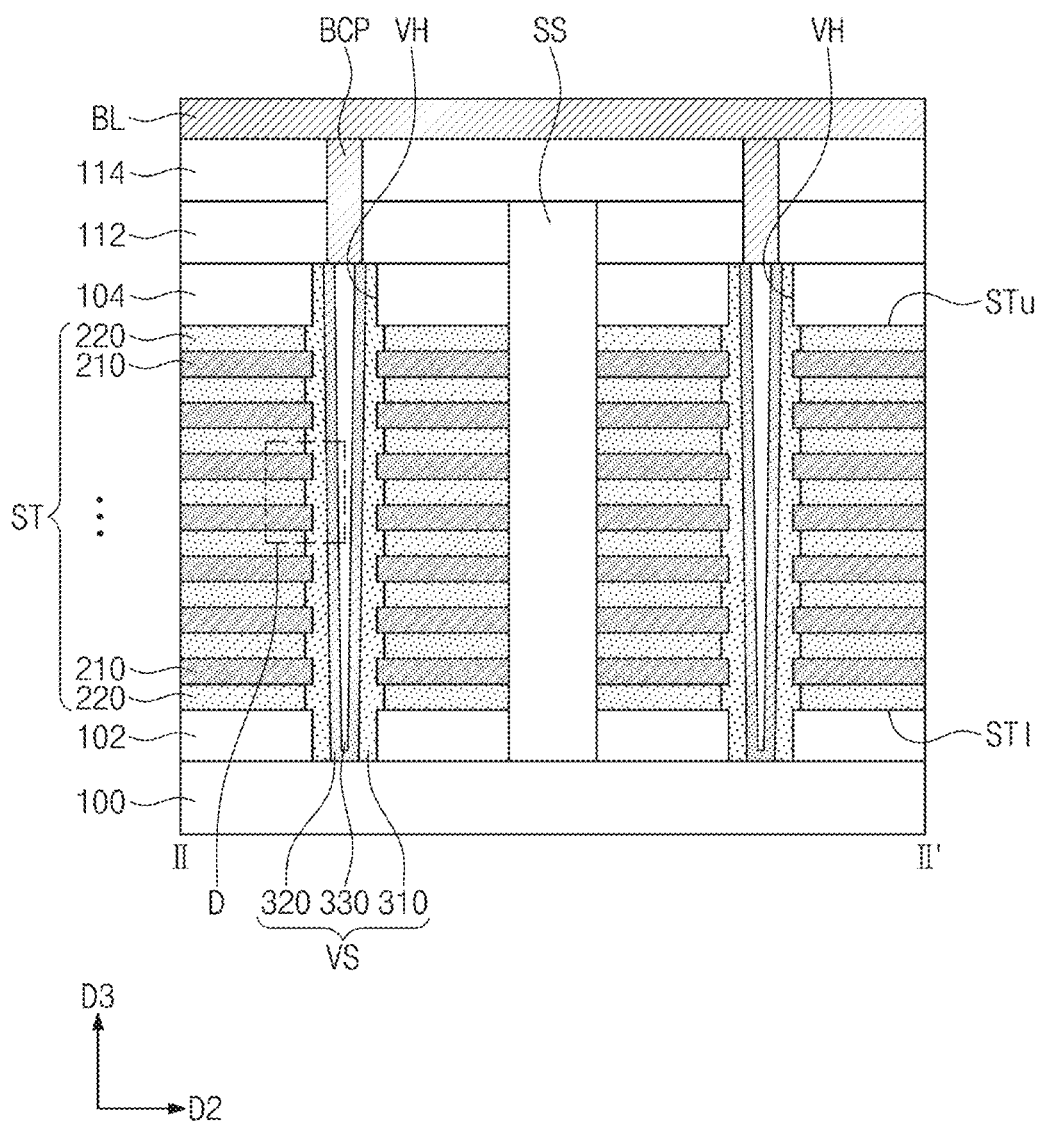
FIG. 9A is a sectional view illustrating a variable resistance memory device according to an example embodiment of the inventive concepts.
Figure 9B:
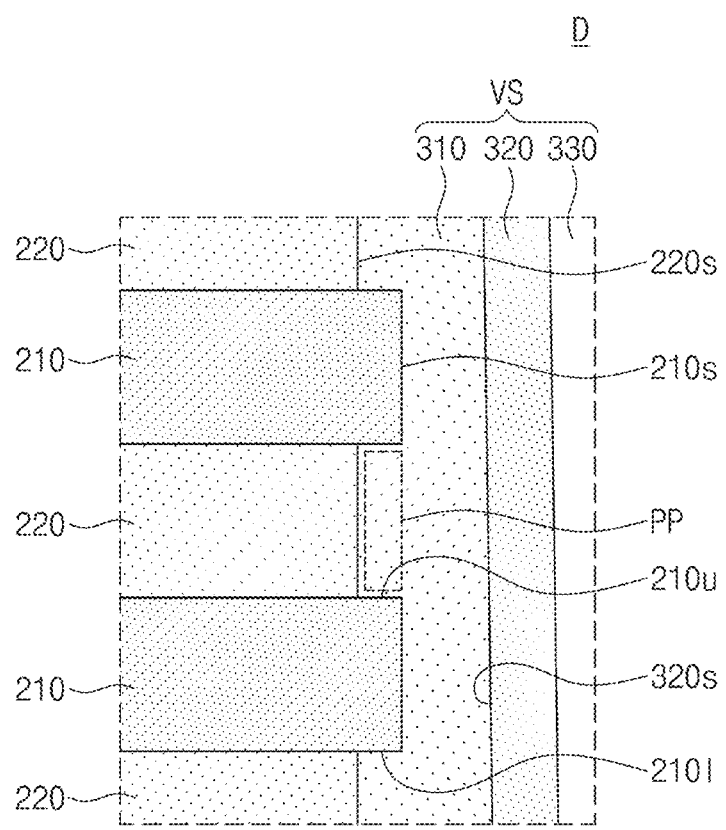
FIG. 9B is an enlarged sectional view illustrating a portion 'D' of FIG. 9A.

FIG. 9A is a sectional view illustrating a variable resistance memory device according to an example embodiment of the inventive concepts. FIG. 9B is an enlarged sectional view illustrating a portion 'D' of FIG. 9A. For concise description, previously described elements may be identified by the same reference numbers without repeating overlapping descriptions thereof.

Referring to FIGS. 9A and 9B, the resistance varying layer 310 may have protruding portions PP which horizontally extend toward side surfaces 220s of the insulating sheets 220. For example, the side surface 320s of the conductive pattern 320 may be farther from the side surfaces 220s of the insulating sheets 220 than from side surfaces 210s of the conductive sheets 210. That is, the side surfaces 220s of the insulating sheets 220 may be recessed in a direction away from the side surface 320s of the conductive pattern 320. The side surfaces 220s of the insulating sheets 220 may be located between a vertically-adjacent pair of the conductive sheets 210 or between a top surface 210u and a bottom surface 210l thereof. The protruding portion PP of the resistance varying layer 310 may fill a space between the top and bottom surfaces 210u and 210l of the conductive sheets 210. The protruding portion PP may be in direct contact with the top and bottom surfaces 210u and 210l of the conductive sheets 210 and the side surfaces 220s of the insulating sheets 220. A vertical thickness of the protruding portion PP may be the same as or substantially equal to a vertical thickness of the insulating sheet 220.

That is, the side surfaces 210s of the conductive sheets 210 may protrude in a direction from the side surfaces 220s of the insulating sheets 220 toward the side surface 320s of the conductive pattern 320. Portions of the top and bottom surfaces 210u and 210l of the conductive sheets 210 may not be covered with the insulating sheets 220. Thus, a contact area between the conductive sheets 210 and carbon nanotubes in the resistance varying layer 310 may be increased. Meanwhile, because a distance between the side surfaces 220s of the insulating sheets 220 and the side surface 320s of the conductive pattern 320 is increased, it may be possible to mitigate or prevent a short circuit from being undesirably formed between the carbon nanotubes in the resistance varying layer 310. Accordingly, it may be possible to improve electric reliability of the variable resistance memory device.

Figure 10:
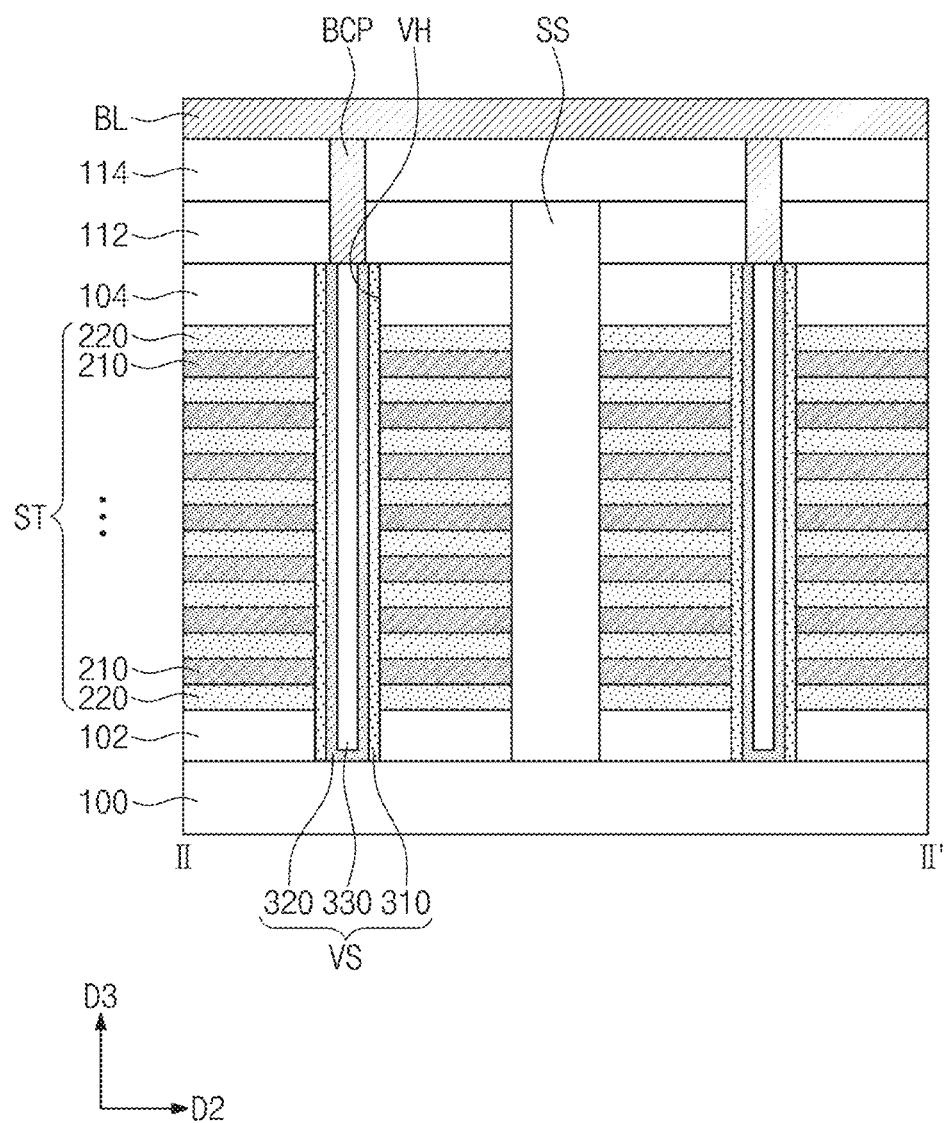
FIGS. 10 and 11 are sectional views illustrating a variable resistance memory device according to an example embodiment of the inventive concepts.
Figure 11:
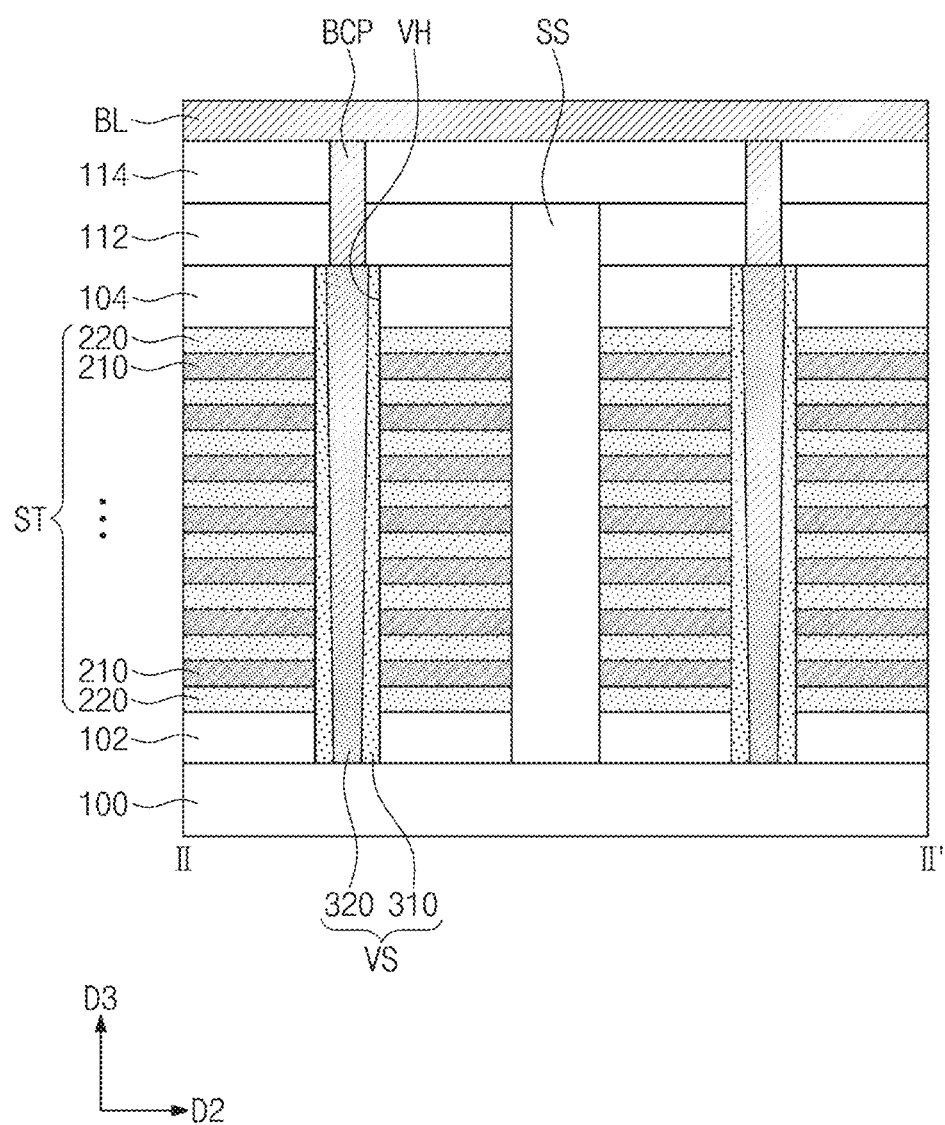

FIGS. 10 and 11 are sectional views illustrating a variable resistance memory device according to an example embodiment of the inventive concepts. For concise description, previously described elements may be identified by the same reference numbers without repeating overlapping descriptions thereof, and features, which are different from those of the variable resistance memory device described with reference to FIGS. 3 to 4B, will be described below.

Referring to FIG. 10, the resistance varying layer 310 may have a uniform thickness. The resistance varying layer 310 may conformally cover the inner side surface VHs of the stack defining the vertical hole VH. The gapfill insulating pattern 330 may have a constant width, regardless of a distance to the substrate 100. A width of a top end of the gapfill insulating pattern 330 may be equal to a width of a bottom end thereof. For example, the gapfill insulating pattern 330 may have a cylindrical shape.

Referring to FIG. 11, the vertical structure VS may be composed of the resistance varying layer 310 and the conductive pattern 320. In other words, the vertical structure VS may not include the gapfill insulating pattern 330 described with reference to FIGS. 3 to 4B.

For example, the resistance varying layer 310 may cover the inner side surface of the stack ST defining the vertical hole VH. The resistance varying layer 310 may have an increasing thickness as a distance to the substrate 100 decreases. The conductive pattern 320 may fully fill a remaining portion of the vertical hole VH, which is partially filled with the resistance varying layer 310. A width of the conductive pattern 320 may decrease as a distance to the substrate 100 decreases.

FIGS. 12A to 12E are sectional views illustrating a method of fabricating a variable resistance memory device, according to an example embodiment of the inventive concepts.

Figure 12A:
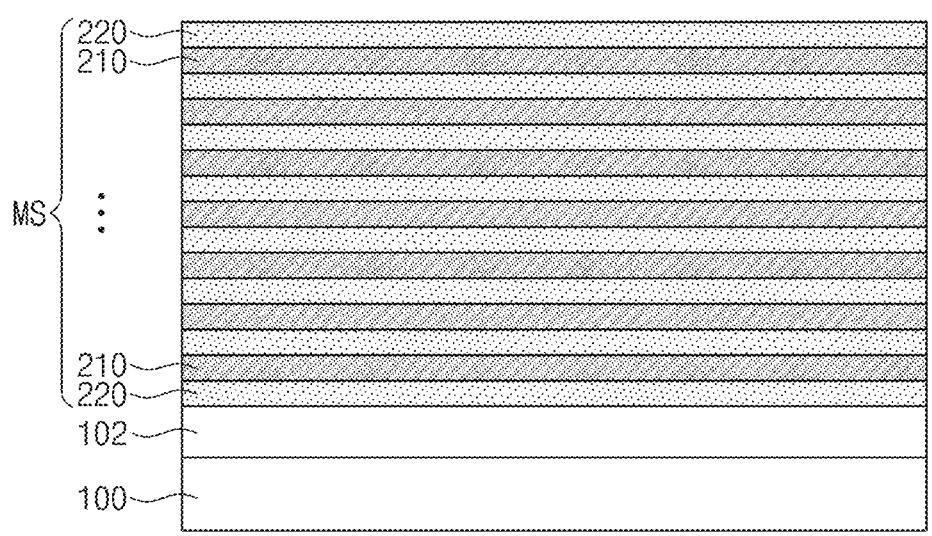
FIGS. 12A to 12E are sectional views illustrating a method of fabricating a variable resistance memory device, according to an example embodiment of the inventive concepts.

Referring to FIG. 12A, the lower insulating layer 102 may be formed on the substrate 100. In an example embodiment, the substrate 100 may be formed of or include a semiconductor material that is doped to have a first conductivity type. The first conductivity type may be, for example, n-type. The lower insulating layer 102 may be formed by performing a chemical vapor deposition (CVD) process on the top surface of the substrate 100. The lower insulating layer 102 may be formed of or include at least one of, for example, silicon oxide or silicon oxynitride.

A mold structure MS may be formed by repeatedly stacking the insulating sheets 220 and the conductive sheets 210 on the lower insulating layer 102. The insulating sheets 220 and the conductive sheets 210 may be alternately formed. The insulating sheets 220 may include bottom and top insulating sheets corresponding to the lowermost and uppermost portions of the mold structure MS, respectively. The conductive sheets 210 may be formed between a pair of the insulating sheets 220, which are vertically adjacent to each other.

For example, the insulating sheet 220 may be formed on the lower insulating layer 102 through a mechanical transfer process or a chemical vapor deposition process. The mechanical transfer process may include attaching a previously-prepared hexagonal boron nitride sheet to the lower insulating layer 102. The chemical vapor deposition process may include directly growing a hexagonal boron nitride sheet on the lower insulating layer 102 using a source material containing nitrogen (N) and boron (B). The source material may include at least one of, for example, $NH_3$, $N_2$, $BH_3$, $BF_3$, $BCl^1_3$, $B_2H_6$, $(CH_3CH_2)_3B$, $(CH_3)_3B$, $H_3NBH_3$, or $(BH)_3(NH)_3$. The conductive sheets 210 may be directly formed on the insulating sheet 220. The formation of the conductive sheets 210 may include growing graphene on the insulating sheet 220 using a chemical vapor deposition process. The insulating sheets 220 and the conductive sheets 210 may be alternately formed to form the mold structure MS.

Figure 12B:
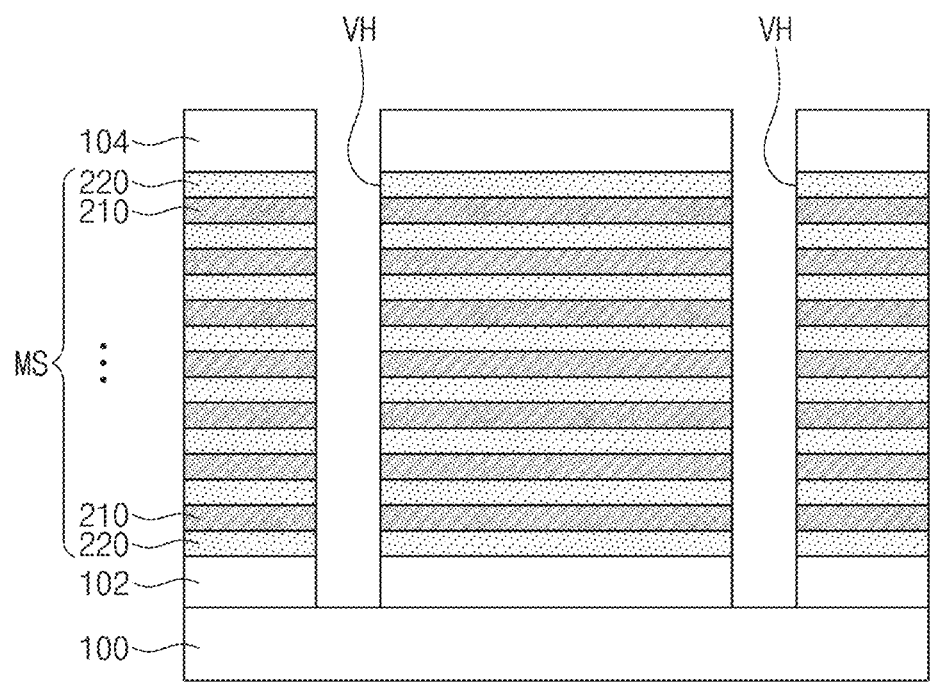

Referring to FIG. 12B, the upper insulating layer 104 may be formed on the mold structure MS, and then, the vertical holes VH may be formed to penetrate the upper insulating layer 104, the mold structure MS, and the lower insulating layer 102. The formation of the vertical holes VH may include forming a mask pattern on the upper insulating layer 104 and performing a reactive ion etching (RIE) process.

Figure 12C:
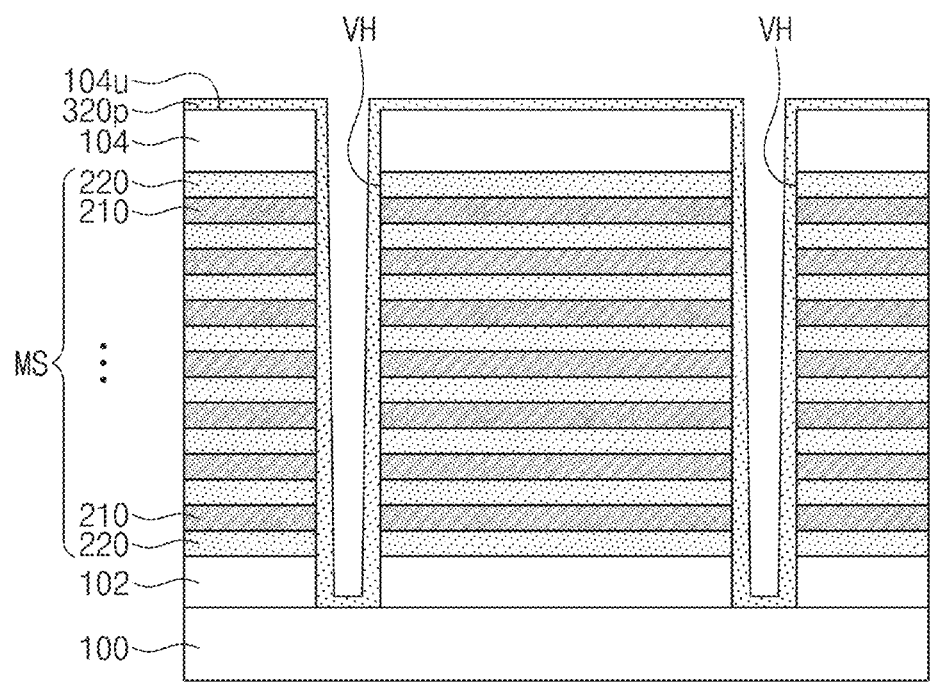

Referring to FIG. 12C, a preliminary resistance varying layer 320p may be formed on the upper insulating layer 104. The preliminary resistance varying layer 320p may be formed to cover the inner side surfaces of the mold structure MS defining the vertical holes VH and the top surface of the upper insulating layer 104. The preliminary resistance varying layer 320p may include one of a single-walled carbon nanotube (SWCNT) and a double-walled carbon nanotube (DWCNT). In an example embodiment, the formation of the preliminary resistance varying layer 320p may include directly providing carbon nanotubes on the top surface of the upper insulating layer 104 and the inner side surfaces of the vertical holes VH using a spin coating process. The carbon nanotubes, which are provided on the top surface of the upper insulating layer 104 and the inner side surfaces of the mold structure MS defining the vertical holes VH, may be attached to exposed surfaces of the upper insulating layer 104 and the mold structure MS defining the vertical holes VH by a van der Waals force. In an example embodiment, the formation of the preliminary resistance varying layer 320p may include supplying a composite material, in which carbon nanotubes are scattered, onto the upper insulating layer 104 using a spin coating process and drying the composite material.

Figure 12D:
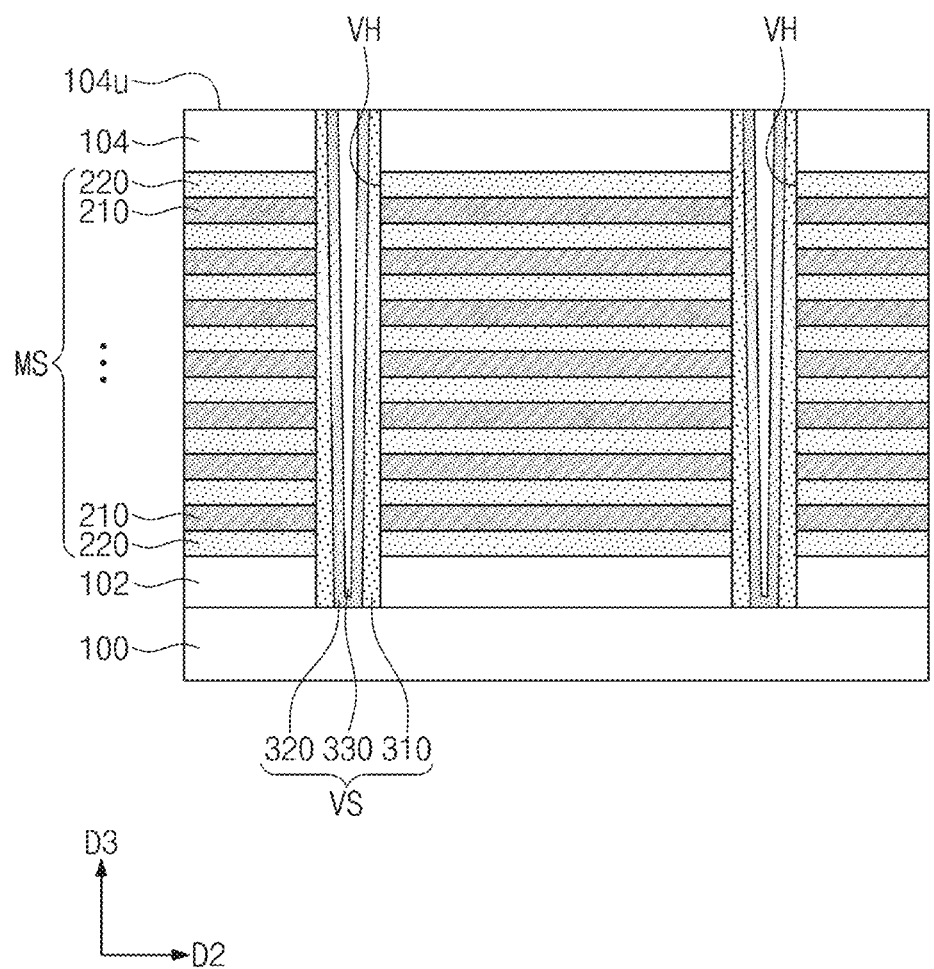

Referring to FIGS. 12C and 12D, the vertical structures VS may be formed by sequentially forming the conductive pattern 320 and the gapfill insulating pattern 330 in the vertical holes VH. For example, a conductive layer may be formed to conformally cover the preliminary resistance varying layer 320p. The forming of the conductive layer may include growing graphene on a surface of the preliminary resistance varying layer 320p using a chemical vapor deposition process. An insulating layer may be formed to fill a remaining portion of the vertical hole VH, which is partially filled with the preliminary resistance varying layer 320p and the conductive layer. The insulating layer may include at least one of, for example, silicon oxide or silicon oxynitride and may be formed by a chemical vapor deposition process. Thereafter, a planarization process may be performed to expose the top surface of the upper insulating layer 104. During the planarization process, the preliminary resistance varying layer 320p, the conductive layer, and the insulating layer may be partially removed to form vertical the vertical structures VS, which are provided in the respective vertical holes VH and are isolated from each other.

Figure 12E:
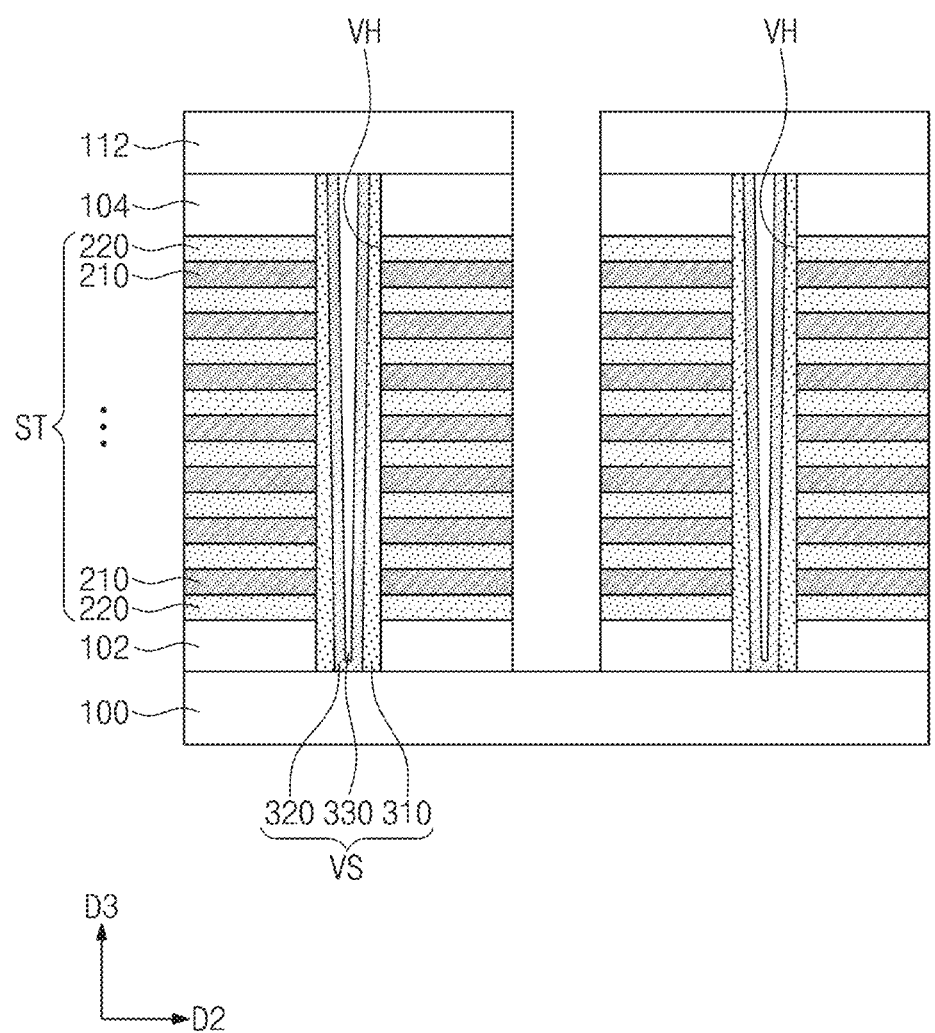

Referring to FIGS. 12D and 12E, the first interlayer insulating layer 112 may be formed on the upper insulating layer 104. The first interlayer insulating layer 112 may be thickly formed using a chemical vapor deposition process. A patterning process may be performed on the mold structure MS to form the stacks ST. The patterning process may include forming a mask pattern on the first interlayer insulating layer 112 and performing an etching process. The etching process may include a reactive ion etching process. The stacks ST may be spaced apart from each other in the second direction D2 by a trench, which is formed by a patterning process and is interposed between the stacks ST. Before forming the stacks ST from the mold structure MS, a trimming process may be performed to form a staircase structure in a portion of the mold structure MS. The staircase structure may be formed on the connection region CNR, as shown in FIG. 3.

Referring back to FIGS. 3 and 4B, the separation structure SS may be formed to fill the trench between the stacks ST. The second interlayer insulating layer 114 may be formed to cover top surfaces of the first interlayer insulating layer 112 and the separation structure SS. Thereafter, the bit line contact plug BCP, the word line contact plug WCP, the bit lines BL, and the conductive lines CL may be formed.

Figure 13:
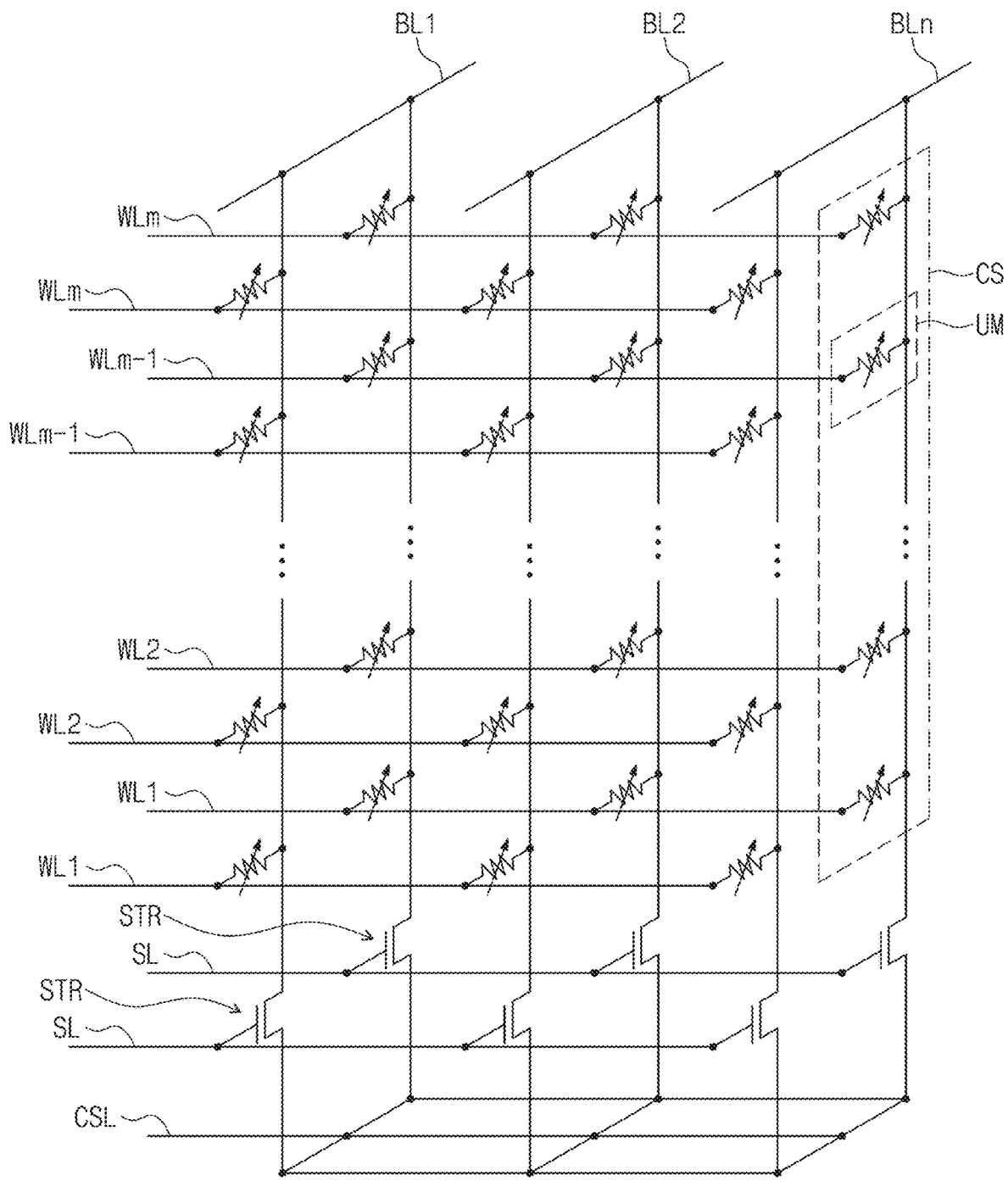
FIG. 13 is a schematic circuit diagram illustrating a variable resistance memory device according to an example embodiment of the inventive concepts.
Figure 14:
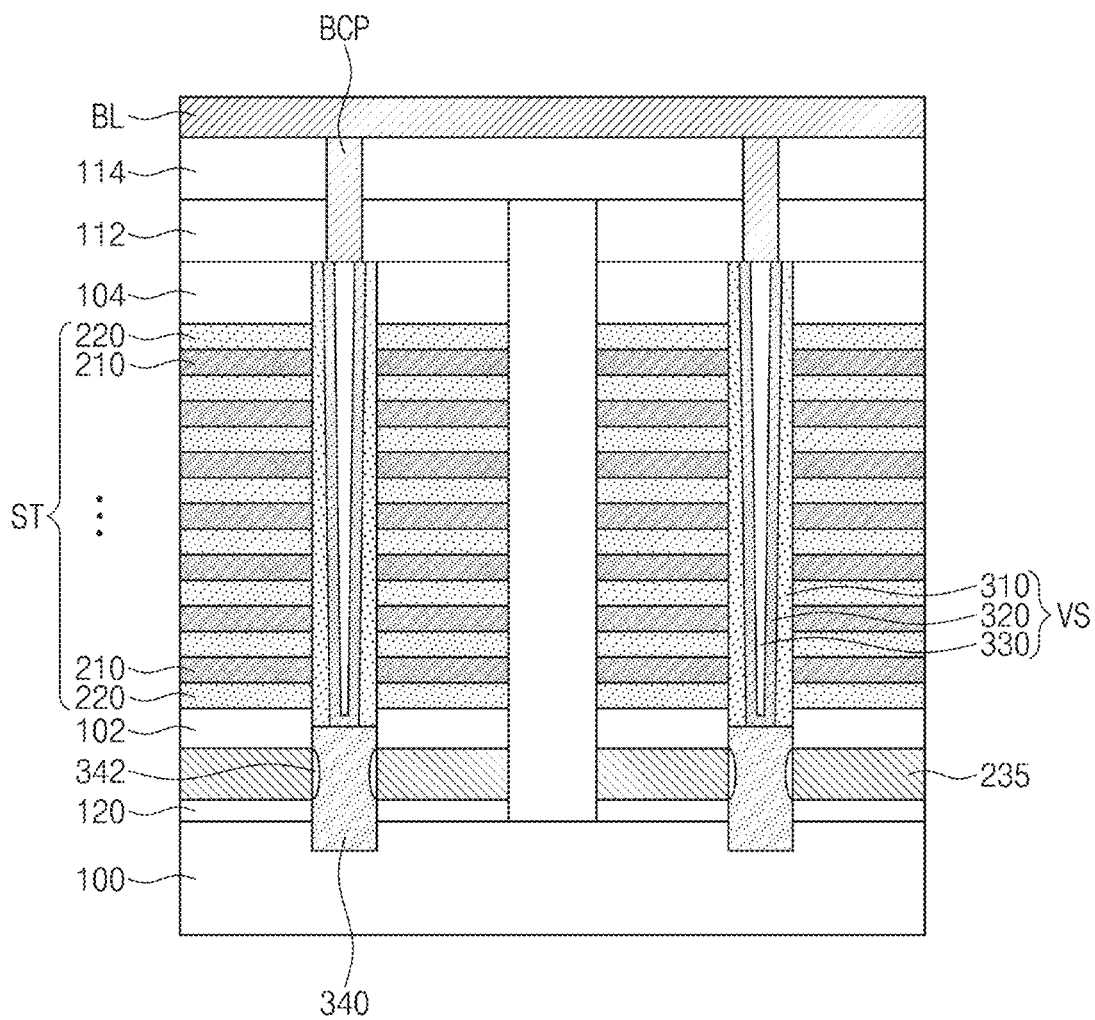
FIG. 14 is a sectional view illustrating a variable resistance memory device according to an example embodiment of the inventive concepts.

FIG. 13 is a schematic circuit diagram illustrating a variable resistance memory device according to an example embodiment of the inventive concepts. FIG. 14 is a sectional view illustrating a variable resistance memory device according to an example embodiment of the inventive concepts. For concise description, previously described elements may be identified by the same reference numbers without repeating overlapping descriptions thereof.

Referring to FIG. 13, the variable resistance memory device may include selection transistors STR, which are provided between the common source line CSL and the cell string CS. For example, the selection transistors STR may be ground selection transistors, which are used to connect or disconnect the cell strings CS to or from the common source line CSL applied with the ground voltage. The selection transistors STR, which are connected to the cell strings CS, respectively, may be connected in common to a selection line SL.

Referring to FIG. 14, a lower interlayer insulating layer 120 may be provided on the top surface of the substrate 100. The lower interlayer insulating layer 120 may be formed of or include at least one of insulating materials (e.g., silicon oxide, silicon nitride, or silicon oxynitride).

A lower conductive line 235 may be provided on a top surface of the lower interlayer insulating layer 120. A top surface of the lower conductive line 235 may be covered with the lower insulating layer 102. The lower conductive line 235 may be the selection line SL described with reference to FIG. 13. A thickness of the lower conductive line 235 may be larger than a thickness of the conductive sheet 210 and a thickness of the insulating sheets 220. The lower conductive line 235 may be formed of or include at least one of, for example, doped semiconductor materials (e.g., doped silicon), metallic materials (e.g., tungsten, copper, and aluminum), conductive metal nitrides (e.g., titanium nitride and tantalum nitride), or transition metals (e.g., titanium and tantalum).

A lower semiconductor pattern 340 may penetrate the lower insulating layer 102, the lower interlayer insulating layer 120, and the lower conductive line 235 and may be connected to the substrate 100. The lower semiconductor pattern 340 may be electrically connected to the conductive pattern 320 of the vertical structure VS. The lower semiconductor pattern 340 may include a pillar-shaped epitaxial layer, which is grown from the substrate 100. The lower semiconductor pattern 340 may be formed of or include silicon (Si). Alternatively, the lower semiconductor pattern 340 may include at least one of germanium (Ge), silicon germanium (SiGe), III-V semiconductor compounds, and/or II-VI semiconductor compounds. A gate insulating layer 342 may be disposed on a portion of a side surface of the lower semiconductor pattern 340. The gate insulating layer 342 may be disposed between the lower conductive line 235 and the lower semiconductor pattern 340. The gate insulating layer 342 may include a silicon oxide layer (e.g., a thermal oxide layer). The gate insulating layer 342 may have a rounded side surface. The lower semiconductor pattern 340, the gate insulating layer 342, and the lower conductive line 235 may constitute the selection transistor STR described with reference to FIG. 13.

Figure 15:
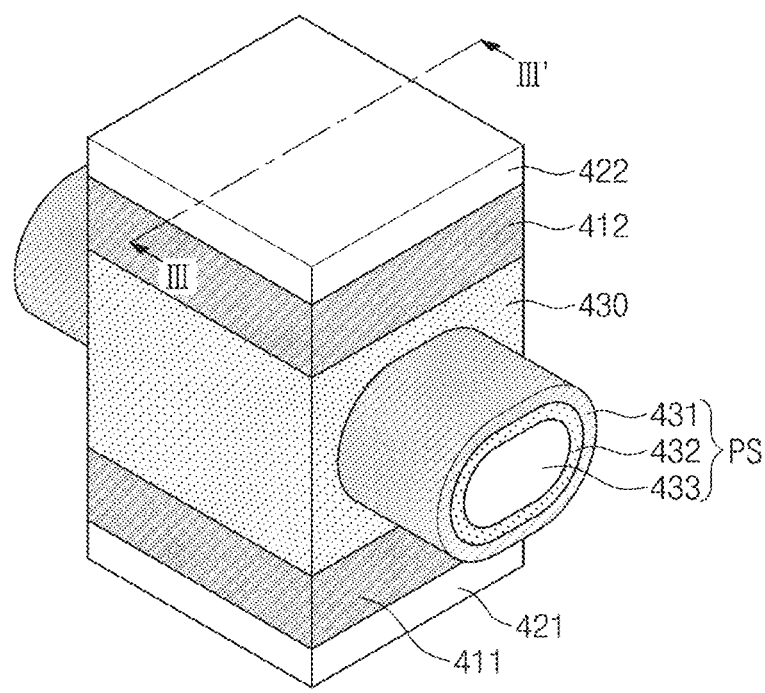
FIG. 15 is a perspective view illustrating a variable resistance memory device according to an example embodiment of the inventive concepts.
Figure 16:
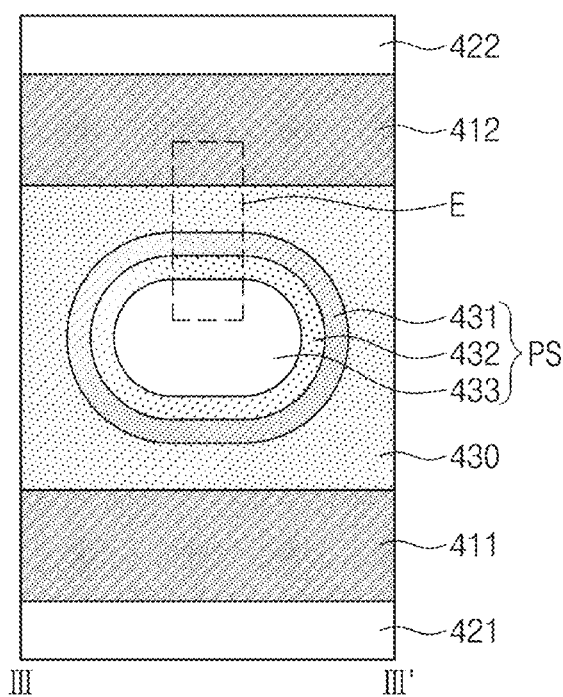
FIG. 16 is a sectional view taken along a line of FIG. 15.

FIG. 15 is a perspective view illustrating a variable resistance memory device according to an example embodiment of the inventive concepts. FIG. 16 is a sectional view taken along a line of FIG. 15.

Referring to FIGS. 15 and 16, a variable resistance memory device may include a lower insulating sheet 421, a lower conductive layer 411, a resistance varying layer 430, an upper conductive layer 412, an upper insulating sheet 422, and a penetration structure PS.

The lower and upper conductive layers 411 and 412 may be disposed to be vertically spaced apart from each other. The lower and upper conductive layers 411 and 412 may be formed of or include a two-dimensional material containing carbon atoms. For example, the lower and upper conductive layers 411 and 412 may be formed of or include graphene. Each of the lower and upper conductive layers 411 and 412 may include a mono-layered graphene containing one graphene sheet. In an example embodiment, each of the lower and upper conductive layers 411 and 412 may include one of a dual-layered graphene, which contains two graphene sheets, and a triple-layered graphene, which contains three graphene sheets.

The resistance varying layer 430 may be located between the lower and upper conductive layers 411 and 412. The resistance varying layer 430 may include carbon nanotubes (CNT). The carbon nanotubes of the resistance varying layer 430 may include one of a single-walled carbon nanotube (SWCNT) or a double-walled carbon nanotube (DWCNT).

The penetration structure PS may be extended in the first direction D1 to penetrate the resistance varying layer 430. The penetration structure PS may include an insulating pillar 433, an insulating sheet 432, and a conductive sheet 431. The insulating pillar 433 may be a bar-shaped pattern extended in the first direction D1. The insulating pillar 433 may have rounded corners. The rounded corners of the insulating pillar 433 may be formed by forming the insulating pillar 433 with sharp corners and performing an isotropic etching process on the insulating pillar 433. The insulating pillar 433 may be formed of or include at least one of insulating materials (e.g., silicon oxide, silicon nitride, or silicon oxynitride).

The insulating sheet 432 may be formed of or include hexagonal boron nitride (h-BN). The insulating sheet 432 may include at least one single-atomic-layered hexagonal boron nitride provided in the form of a single atomic layer. In an example embodiment, the insulating sheet 432 may include a plurality of single-atomic-layered hexagonal boron nitrides.

The conductive sheet 431 may be formed of or include a two-dimensional material containing carbon atoms. The conductive sheet 431 may include graphene. The conductive sheet 431 may include one of a dual-layered graphene, which contains two layers of single-atomic-layered graphene, and a triple-layered graphene, which contains three layers of single-atomic-layered graphene.

Figure 17:
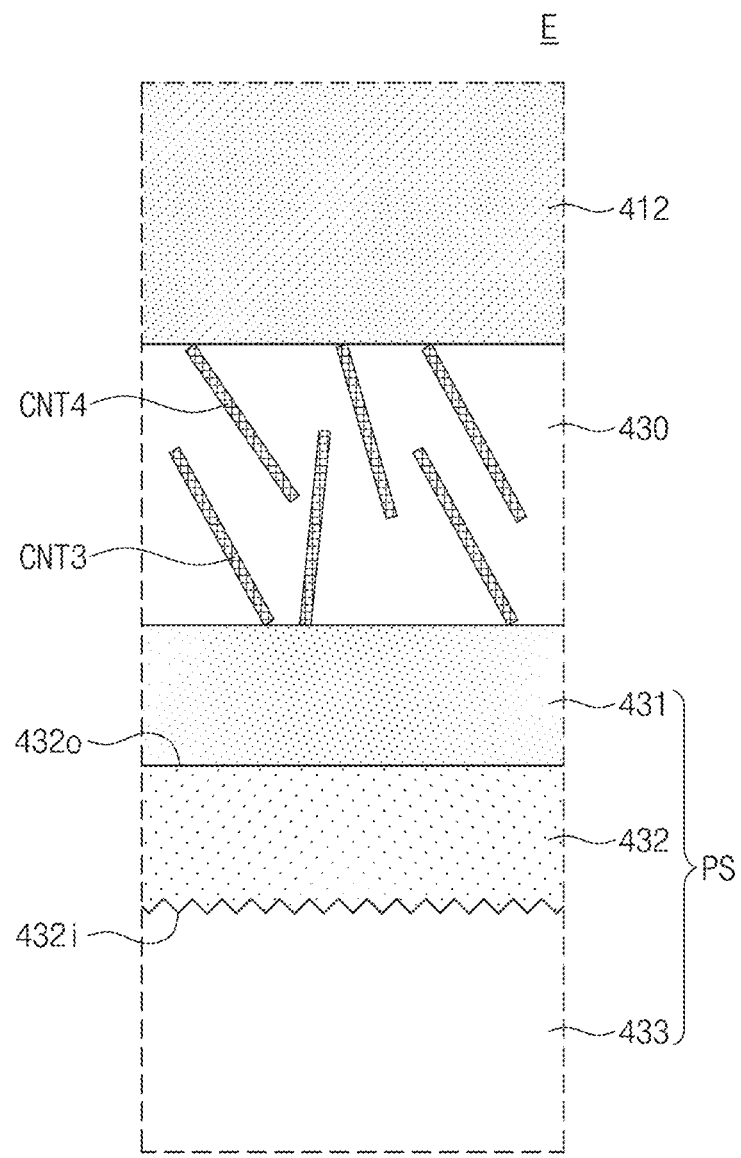
FIG. 17 is an enlarged sectional view illustrating a portion 'E' of FIG. 16.

FIG. 17 is an enlarged sectional view illustrating a portion 'E' of FIG. 16.

Referring to FIGS. 16 and 17, the insulating sheet 432 may have a first surface 432$i$ and a second surface 432$o$, which are provided to face the insulating pillar 433 and the conductive sheet 431, respectively. The second surface 432$o$ may have a surface roughness that is lower than the first surface 432$i$.

The resistance varying layer 430 may include third carbon nanotubes CNT3 and fourth carbon nanotubes CNT4. The third carbon nanotubes CNT3 may be attached to the conductive sheet 431 and may be electrically connected to the conductive sheet 431. Some of the fourth carbon nanotubes CNT4 may be attached to the upper conductive layer 412 and may be electrically connected to the upper conductive layer 412. Although not shown, others of the fourth carbon nanotubes CNT4 may be attached to the lower conductive layer 411 and may be electrically connected to the lower conductive layer 411. Resistance of the resistance varying layer 430 may vary depending on voltages, which are applied to the conductive sheet 431, the upper conductive layer 412, and the lower conductive layer 411. The resistance of the resistance varying layer 430 may be locally adjusted depending on a change in disposition and connection of the third and fourth carbon nanotubes CNT3 and CNT4. The disposition and connection of the third and fourth carbon nanotubes CNT3 and CNT4 may be changed in an analogous manner to that described with reference to FIGS. 7A and 7B.

Data may be written in the variable resistance memory device by locally controlling the resistance of the resistance varying layer 430. Data in the variable resistance memory device may be determined by measuring a resistance between the upper conductive layer 412 and the conductive sheet 431 or a resistance between the lower conductive layer 411 and the conductive sheet 431.

According to an example embodiment of the inventive concepts, a resistance varying layer may include carbon nanotube. A resistance of the resistance varying layer may be locally changed by a mechanical change or deformation of the carbon nanotube, and the carbon nanotube may be restored to its original (e.g., undeformed) state by its own elastic force. This may make it possible to realize a variable resistance memory device with improved endurance.

Any functional blocks shown in the figures and described above may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments of the inventive concepts have been particularly shown and described, it will be understood by one of ordinary skill in the art that variations in form and detail may be made therein without departing from the spirit and scope of the attached claims.

What is claimed is:

1. A variable resistance memory device, comprising:
   a stack including insulating sheets and conductive sheets, which are alternatingly stacked on a substrate, the stack including a vertical hole vertically penetrating therethrough;
   a bit line on the stack;
   a conductive pattern electrically connected to the bit line and vertically extending in the vertical hole; and
   a resistance varying layer between the conductive pattern and an inner side surface of the stack defining the vertical hole,
   wherein the resistance varying layer comprises a first carbon nanotube electrically connected to the conductive sheets, and a second carbon nanotube electrically connected to the conductive pattern.

2. The variable resistance memory device of claim 1, wherein each of the first and second carbon nanotubes comprises one of a single-walled carbon nanotube (SWCNT) and a double-walled carbon nanotube (DWCNT).

3. The variable resistance memory device of claim 1, wherein the resistance varying layer has an increasing thickness as a distance to the substrate decreases.

4. The variable resistance memory device of claim 1, wherein the first and second carbon nanotubes are configured to be in contact with each other or to be separated from each other, depending on a voltage applied to the bit line.

5. The variable resistance memory device of claim 1, wherein
   the resistance varying layer further comprises a third carbon nanotube on side surfaces of the insulating sheets, and
   the third carbon nanotube is electrically disconnected from the conductive sheets and the conductive pattern.

6. The variable resistance memory device of claim 1, wherein the resistance varying layer comprises a protruding portion protruding toward side surfaces of the insulating sheets.

7. The variable resistance memory device of claim 1, wherein a top surface of the resistance varying layer is at a same vertical level as a top surface of the conductive pattern.

8. The variable resistance memory device of claim 1, wherein the insulating sheets comprise hexagonal boron nitride (h-BN).

9. The variable resistance memory device of claim 1, wherein the conductive sheets comprise graphene.

10. The variable resistance memory device of claim 1, wherein a top surface of an uppermost insulating sheet of the insulating sheets has a surface roughness that is higher than a bottom surface of the uppermost insulating sheet.

11. The variable resistance memory device of claim 1, wherein a top surface of a lowermost insulating sheet of the insulating sheets has a surface roughness that is lower than a bottom surface of the lowermost insulating sheet.

12. The variable resistance memory device of claim 1, further comprising:
    a lower semiconductor pattern connecting a bottom end of the conductive pattern to the substrate.

13. The variable resistance memory device of claim 1, further comprising:
    a gapfill insulating pattern buried in the conductive pattern and extending vertically,
    wherein the gapfill insulating pattern has a decreasing width as a distance to the substrate decreases.

14. A variable resistance memory device, comprising:
    a stack on a substrate and extended in a first direction, the stack comprising insulating sheets and conductive sheets alternately stacked, the stack including a vertical hole vertically penetrating therethrough;
    a conductive pattern in the vertical hole and extending vertically; and
    a resistance varying layer between the conductive pattern and an inner side surface of the stack defining the vertical hole and extending vertically,
    wherein the resistance varying layer comprises carbon nanotubes electrically connected to at least one of the conductive sheets and the conductive pattern, and
    a thickness of the resistance varying layer in the first direction increases as a distance to the substrate decreases.

15. The variable resistance memory device of claim 14, wherein the carbon nanotubes comprise a first carbon nanotube electrically connected to a corresponding one of the conductive sheets and a second carbon nanotube electrically connected to the conductive pattern.

16. The variable resistance memory device of claim 14, wherein the carbon nanotubes comprise a third carbon nanotube on side surfaces of the insulating sheets, and the third carbon nanotube is electrically disconnected from the conductive sheets and the conductive pattern.

17. The variable resistance memory device of claim 14, wherein the resistance varying layer comprises a protruding portion protruding toward side surfaces of the insulating sheets.

18. The variable resistance memory device of claim 14, wherein a top surface of an uppermost insulating sheet of the insulating sheets has a surface roughness that is higher than a bottom surface of the uppermost insulating sheet.

19. The variable resistance memory device of claim 14, wherein a top surface of a lowermost insulating sheet of the insulating sheets has a surface roughness that is lower than a bottom surface of the lowermost insulating sheet.

20. A variable resistance memory device, comprising:
a substrate including a cell array region and a connection region;
a stack including insulating sheets and conductive sheets, which are alternatingly stacked on the substrate, the stack having pads arranged in a stepwise manner on the connection region;
a vertical structure on the cell array region and vertically penetrating the stack, the vertical structure comprising a conductive pattern and a resistance varying layer, the conductive pattern extending vertically, and the resistance varying layer covering an outer side surface of the conductive pattern; and
a lower insulating layer between a top surface of the substrate and a bottom surface of the stack, the lower insulating layer having a top surface being at a level higher than a bottom surface of the vertical structure,
wherein a top surface of a lowermost insulating sheet of the insulating sheets has a surface roughness that is lower than the top surface of the lower insulating layer.

* * * * *